(12) United States Patent
Yamazoe et al.

(10) Patent No.: US 8,321,815 B2
(45) Date of Patent: Nov. 27, 2012

(54) RECORDING MEDIUM STORING ORIGINAL DATA GENERATION PROGRAM, ORIGINAL DATA GENERATION METHOD, ORIGINAL FABRICATING METHOD, EXPOSURE METHOD, AND DEVICE MANUFACTURING METHOD

(75) Inventors: Kenji Yamazoe, Berkeley, CA (US); Tokuyuki Honda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 452 days.

(21) Appl. No.: 12/512,649

(22) Filed: Jul. 30, 2009

(65) Prior Publication Data

US 2010/0037199 A1 Feb. 11, 2010

(30) Foreign Application Priority Data

Aug. 6, 2008 (JP) .................. 2008-203251

(51) Int. Cl.
 *G06F 17/50* (2006.01)
(52) U.S. Cl. .............. 716/50; 716/51; 716/54
(58) Field of Classification Search .......... 716/50, 716/51, 54
See application file for complete search history.

(56) References Cited

U.S. PATENT DOCUMENTS

| | | | |
|---|---|---|---|
| 6,738,859 B2 * | 5/2004 | Liebchen | 716/51 |
| 7,088,419 B2 * | 8/2006 | Dowski et al. | 355/18 |
| 7,124,394 B1 | 10/2006 | Abrams | |
| 7,310,796 B2 * | 12/2007 | Schwarzband | 382/144 |
| 2006/0269875 A1 | 11/2006 | Granik | |
| 2008/0052334 A1 * | 2/2008 | Yamazoe | 708/191 |
| 2009/0027650 A1 * | 1/2009 | Yamazoe | 355/77 |

FOREIGN PATENT DOCUMENTS

| | | |
|---|---|---|
| EP | 1439420 A1 | 7/2004 |
| EP | 1879072 A2 | 1/2008 |
| EP | 2019332 A1 | 1/2009 |
| EP | 2040120 A1 | 3/2009 |
| KR | 10-0719154 A | 7/2004 |
| KR | 10-2008-0006480 A | 1/2008 |

OTHER PUBLICATIONS

Kenji Yamazoe et al: "Resolution enhancement by aerial image approximation with 2D-TCC" Proceedings of the International Society for Optical Engineering (SPIE), SPIE, USA LNKD-DOI:10.117. 746862, vol. 6730, No. 6730H, Jan. 1, 2007, pp. 6730H-1, XP007913449 ISSN: 0277-786x.

"Solving Inverse Problems of Optical Microlithography"; Yuri Granik; Optical Microlithography XVIII, edited by Bruce W. Smith, Proceedings of SPIE vol. 5754 (SPIE, Bellingham, WA, 2005); pp. 506-526.

* cited by examiner

*Primary Examiner* — Sun Lin
(74) *Attorney, Agent, or Firm* — Canon USA, Inc., IP Division

(57) ABSTRACT

To calculate data of an original, a computer is caused to execute the following steps of converting data regarding an intended pattern to be formed on a substrate into frequency-domain data, calculating a two-dimensional transmission cross coefficient using a function representing an effective light source that an illumination device forms on a pupil plane of a projection optical system when the original is absent on an object plane of the projection optical system and using a pupil function of the projection optical system, calculating a diffracted light distribution from a pattern that is formed on the object plane using both the frequency-domain data and data of at least one component of the calculated two-dimensional transmission cross coefficient, and converting data of the calculated diffracted light distribution into spatial-domain data to determine the data of the original.

11 Claims, 15 Drawing Sheets

RECORDING MEDIUM STORING ORIGINAL DATA GENERATION PROGRAM, ORIGINAL DATA GENERATION METHOD, ORIGINAL FABRICATING METHOD, EXPOSURE METHOD, AND DEVICE MANUFACTURING METHOD

BACKGROUND OF THE INVENTION

1. Field of the Invention

The present invention relates to a recording medium storing an original data generation program, an original data generation method, an original fabricating method, an exposure method, and a device manufacturing method.

2. Description of the Related Art

Recently, higher resolution has been demanded in a projection exposure apparatus for projecting a circuit pattern drawn on an original plate (hereinafter, referred to as an original, such as a mask or a reticle) onto a wafer through a projection optical system. As methods for achieving high resolution, a method using a projection optical system with a high numerical aperture (NA), a method for using a shorter exposure wavelength ($\lambda$), and a method for reducing a k1 factor are known.

As the k1 factor becomes smaller, a mask pattern deviates from a pattern formed on a wafer. In the related art, an optimum mask pattern is calculated by repeatedly modifying the mask pattern until an intended pattern (target pattern) is formed on a wafer.

However, recently, a method for determining a mask pattern from an intended pattern to be formed on a wafer plane has attracted the attention. This method relates to the so-called inverse lithography. The idea of the inverse lithography was suggested in the 1980s. However, a calculation method was not established at that time and a practical mask designing method was not realized with the capacity of computers used in those days.

Thanks to recent establishment of a calculation method and recent improvement in the capacity of computers, various inverse lithography techniques have been proposed. Methods disclosed in US Patent Application Publication No. 2006/0269875 and U.S. Pat. No. 7,124,394 are available. Additionally, a method described in "Solving inverse problems of optical microlithography", Proc. of SPIE, USA, SPIE press, 2005, Vol. 5754, pp. 506-526 (written by Yuri Granik) is considered as a standard method of the inverse lithography.

In the above-described related art, a light intensity distribution on a wafer is represented as a sum of a plurality of eigenfunctions. The complex calculations used can require a lot of time. Moreover, solution of an optimization problem in the related art generally takes a lot of time. The related art thus can be both complex to implement and slow.

SUMMARY OF THE INVENTION

The present invention provides an original data generation program and an original data generation method for allowing original data for accurately forming an intended pattern on a substrate to be calculated with a small calculation amount.

According to an aspect of the present invention, an original data generation program for allowing a computer to calculate data of an original to be used when an image of a pattern of the original is projected onto a substrate through a projection optical system by illuminating the original with an illumination device, includes computer-executable instructions for setting an intended pattern to be formed on the substrate, computer-executable instructions for converting data regarding the intended pattern into frequency-domain data, computer-executable instructions for calculating a two-dimensional transmission cross coefficient using a function representing a light intensity distribution that the illumination device forms on a pupil plane of the projection optical system when the original is absent on an object plane of the projection optical system and using a pupil function of the projection optical system, computer-executable instructions for calculating a diffracted light distribution from a pattern that is formed on the object plane using both the frequency-domain data and data of at least one component of the calculated two-dimensional transmission cross coefficient, and computer-executable instructions for converting data of the calculated diffracted light distribution into spatial-domain data and determining the data of the original using the spatial-domain data. For example, the program may be stored on a computer-readable recording medium and loaded into a memory of the computer for execution of the computer-executable instructions.

According to another aspect of the present invention, an original data generation method for calculating data of an original to be used when an image of a pattern of the original is projected onto a substrate through a projection optical system by illuminating the original with an illumination device, includes setting an intended pattern to be formed on the substrate, converting data regarding the intended pattern into frequency-domain data, calculating a two-dimensional transmission cross coefficient using a function representing a light intensity distribution that the illumination device forms on a pupil plane of the projection optical system when the original is absent on an object plane of the projection optical system and using a pupil function of the projection optical system, calculating a diffracted light distribution from a pattern that is formed on the object plane using both the frequency-domain data and data of at least one component of the calculated two-dimensional transmission cross coefficient, and converting data of the calculated diffracted light distribution into spatial-domain data and determining the data of the original using the spatial-domain data.

Further features and functions of the present invention will become apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate exemplary embodiments of the invention and, together with the description, serve to explain the principles of the invention.

DESCRIPTION OF THE EMBODIMENTS

Figure 1:
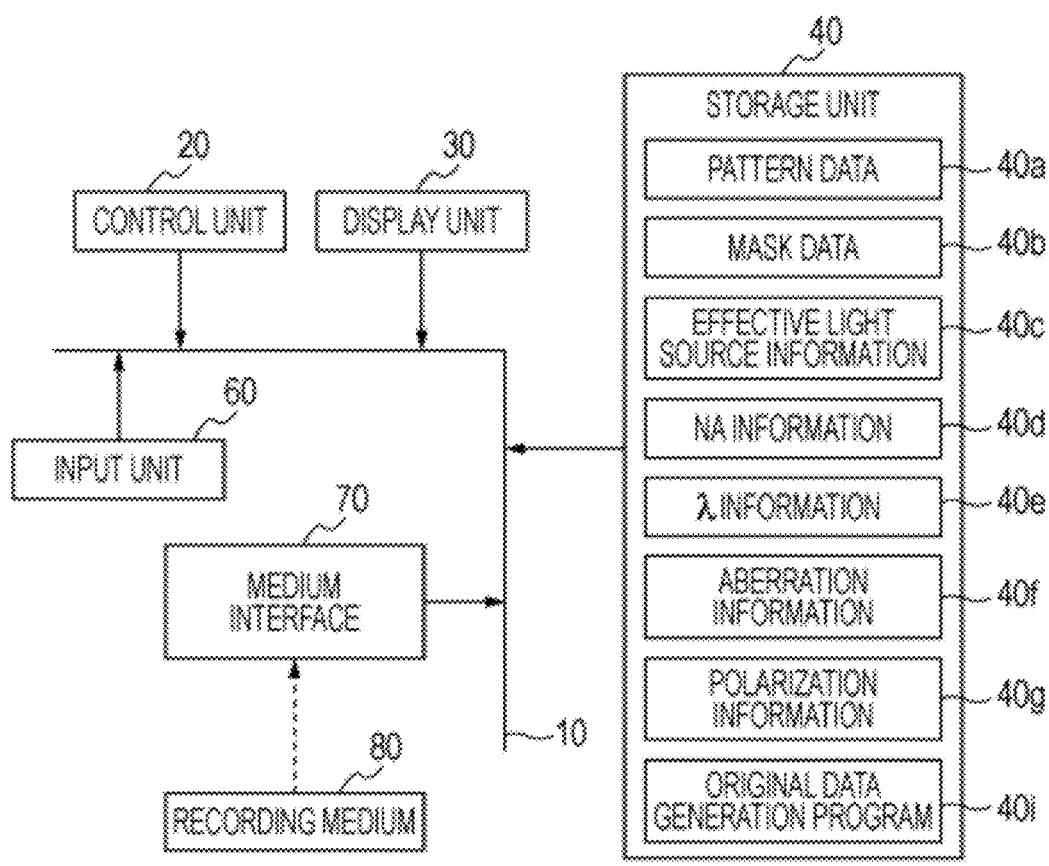
FIG. 1 is a diagram showing a configuration of a computer for executing an original data generation program according to an exemplary embodiment of the present invention.

Exemplary embodiments of the present invention will now be described in detail with reference to the accompanying drawings.

The present invention can be mathematically modeled and implemented using software that executes on a computer system. The software of the computer system includes a program of computer-executable instructions and executes calculation of original data in various exemplary embodiments of the present invention. The program is executed by a processor (such as a central processing unit (CPU) or microprocessing unit (MPU)) of the computer system. During execution of the program, the program is stored in a computer platform, and data used by or produced by the program is also stored in the computer platform. The program may also be stored in other locations and loaded to an appropriate computer system for execution. The program can be stored on a computer-readable recording medium as one or more modules. An exemplary embodiment of the present invention can be written in a format of the above-described program of computer-executable instructions and can function as one or more software products.

Examples of the computer-readable recording medium on which the program may be stored and through which the program may be supplied include, for example, a floppy disk, a hard disk, an optical disk, a magneto-optical disk, a read-only memory (ROM), a compact disk read-only memory (CD-ROM), a CD-Recordable (CD-R), a digital versatile disk ROM (DVD-ROM), a magnetic tape, a non-volatile memory card, and a flash memory device.

A coordinate system of an exposure apparatus according to an exemplary embodiment of the present invention will now be described. The coordinate system of the exposure apparatus is mainly divided into two in this exemplary embodiment. One coordinate system is coordinates on a mask plane (i.e., an object plane of a projection optical system) and a wafer plane (i.e., an image plane of the projection optical system). In this exemplary embodiment, this coordinate system is represented as (x, y). The size of a pattern on the mask plane and the size of a pattern on the wafer plane differ in accordance with magnification of the projection optical system. However, for ease of explanation, the size of the pattern on the mask plane and the size of the pattern on the wafer plane are set be 1:1 by multiplying the magnification of the projection optical system and the size of the pattern on the mask plane. Accordingly, the coordinate system on the mask plane and the coordinate system on the wafer plane are set to be 1:1.

Another coordinate system coordinates on the pupil plane of a projection optical system. In an exemplary embodiment of the present invention, this coordinate system is represented as (f, g). Coordinates (f, g) on the pupil plane of the projection optical system is a coordinate system that is standardized to have a pupil radius of the projection optical system equal to 1.

In an exposure apparatus, a light intensity distribution formed on the pupil plane of the projection optical system with no mask being placed on an object plane of the projection optical system is referred to as an effective light source, which is represented as S(f, g) in this exemplary embodiment. The pupil of the projection optical system is represented by a pupil function P(f, g) in this exemplary embodiment. Since effects (information) of aberration and polarization can be incorporated in the pupil function, the pupil function generally includes the effect of aberration and polarization.

The exposure apparatus illuminates a mask serving as an original with a partially coherent illumination so as to project a pattern of the mask (i.e., a mask pattern) onto a wafer serving as a substrate. In this exemplary embodiment, a mask pattern including transmittance and phase information is defined as o(x, y), whereas a light intensity distribution (aerial image) formed on an image plane (wafer plane) of the projection optical system is defined as I(x, y). Additionally, the amplitude of the light that is diffracted by the mask pattern is defined at the pupil plane of the projection optical system and is represented as a(f, g) in this exemplary embodiment.

A partially coherent imaging calculation, according to the related art, will now be described. The partially coherent imaging calculation (calculation of the light intensity distribution at the image plane of the projection optical system) can be mainly categorized into three kinds of calculation methods.

A first calculation method is the light source plane integral method (so-called Abbe's method). More specifically, as indicated by Equation 1, the light intensity distribution I(x, y) is calculated with the light source plane integral method.

$$I(x, y) = \sum_{i=1}^{N_1} S(f'_i, g'_i) |F[P(f, g)a(f - f'_i, g - g'_i)]|^2 \qquad \text{Equation 1}$$

In Equation 1, $N_1$ denotes the calculative number of point-source lights, whereas F denotes Fourier transform.

A second calculation method is a calculation method executed without performing eigenvalue-factoring of a transmission cross coefficient (TCC). The TCC is defined as represented by Equation 2.

$$TCC(f', g', f'', g'') = \qquad \text{Equation 2}$$
$$\sum_{f,g} S(f, g) P(f + f', g + g') P^*(f + f'', g + g'')$$

Asterisk "*" denotes a complex conjugate. Equation 2 indicates that the TCC is a four-dimensional function. The light intensity distribution I(x, y) can be calculated from Equation 3 using the TCC.

$$I(x, y) = \sum_{i,j,k,l=1}^{N_2} TCC(f'_i, g'_j, f''_k, g''_l) a(f'_i, g'_j) \qquad \text{Equation 3}$$
$$a^*(f''_k, g''_l) \times \exp\{-i2\pi[(f'_i - f''_k)x + (g'_j - g''_l)y]\}$$

In Equation 3, $N_2$ denotes possible kinds (values) of i, j, k, and l and depends on the calculative number of divided pupils.

A third calculation method is called SOCS. In the SOCS, the TCC represented by Equation 2 is divided into a plurality of eigenvalues and eigenfunctions. Suppose that an i-th eigenvalue and an i-th eigenfunction are denoted as $\lambda_i$ and $\psi_i(f, g)$, respectively. The light intensity distribution I(x, y) is calculated with Equation 4.

$$I(x, y) = \sum_{i=1}^{N_3} \lambda_i |F[\psi_i(f, g) a(f, g)]|^2 \qquad \text{Equation 4}$$

In Equation 4, $N_3$ denotes the calculative number of point-source lights. In the inverse lithography described in "Solving inverse problems of optical microlithography" cited above, an optimization problem is solved using Equation 4. By using the first eigenvalue obtained by sorting eigenvalues according to the magnitude thereof in Equation 4 and using a corresponding eigenfunction, the light intensity distribution I(x, y) is approximated as represented by Equation 5.

$$I(x,y) \approx \lambda_1 |F[\psi_1(f,g) a(f,g)]|^2 \qquad \text{Equation 5}$$

Although Equation 5 can reduce complexity of the optimization problem since partial coherent imaging is simplified, accuracy of an optimal solution is low.

The present invention will now be described. In this exemplary embodiment of the present invention, an Equation obtained by modifying Equation 3 is used instead of Equation 4 and Equation 5. First, Equation 3 is modified into Equation 6.

$$I(x, y) = \sum_{f',g'} a(f', g') \exp[-i2\pi(f'x + g'y)] \times \qquad \text{Equation 6}$$
$$F^{-1}[W_{f',g'}(f'', g'') a^*(f'', g'')]$$

$F^{-1}$ denotes inverse Fourier transform. $W_{f',g'}(f'', g'')$ is defined for a fixed (f', g') as represented by Equation 7.

$$W_{f',g'}(f'',g'') = TCC(f',g',f'',g'') \qquad \text{Equation 7}$$

Since (f', g') is fixed, $W_{f',g'}(f'', g'')$ is a two-dimensional function and, thus, is referred to as a two-dimensional transmission cross coefficient.

It is assumed that the center of an effective light source corresponds to a point f=g=0 and is located at the origin of a pupil coordinate system. A sum of overlapping parts of a function obtained by shifting the pupil function P(f, g) of the projection optical system by (f', g') from the origin, a function obtained by shifting a complex conjugate P*(f, g) of the pupil function of the projection optical system by (f'', g'') from the origin, and a function representing the effective light source is defined as the TCC.

On the other hand, $W_{f',g'}(f'', g'')$ is defined when a shift amount of the pupil function P(f, g) is a predetermined amount (f', g'). An overlapping part of the function representing the effective light source and the function obtained by shifting the pupil function P by (f', g') from the origin is defined as a sum of the overlapping part of the function obtained by shifting the complex conjugate P*(f, g) of the pupil function by (f'', g'') from the origin.

More specifically, the two-dimensional transmission cross coefficient is obtained by performing convolution integral of a complex conjugate function P*(f, g) of the pupil function and a product of the function S(f, g) representing the effective light source and the function P(f+f', g+g') obtained by shifting the pupil function by (f', g'). By determining the two-dimensional transmission cross coefficient under all conditions that can be set for (f', g'), the four-dimensional transmission cross coefficient TCC can be determined.

Since Equation 6 does not require calculation of the four-dimensional function TCC and only dual-loop calculation of the two-dimensional transmission cross coefficient is performed, a calculation amount can be reduced and time for calculation can be shortened.

If Fourier transform is performed on both sides of Equation 6, an approximate expression represented by Equation 8 is obtained. Phase terms are ignored at the time of determination of Equation 8.

$$F[I(x, y)] = \sum_{f',g'} a(f', g') W_{f',g'}(f, g) a^*(f, g) \qquad \text{Equation 8}$$

Processing for determining a(f, g) shown in Equation 8 will be described below. I(x, y) shown in Equation 8 denotes a light intensity distribution of an intended pattern and, thus, is known. $W_{f,g}(f, g)$ can be determined from the effective light source.

Suppose that a function obtained by converting $I(x, y)$ into frequency-domain data using Fourier transform or the like is represented as $I'(f, g)$. There are M values of $I'(f, g)$ in total, and these values are represented as $I'_1, I'_2, \ldots, I'_M$. Similarly, there are M values of $a(f, g)$, and these values are represented as $a_1, a_2, \ldots, a_M$. There are M values of $W_{f,g}(f, g)$ for one combination of f' and g', and these values are represented as $g_{11}, g_{12}, \ldots, g_{1M}$. Likewise, $W_{f,g}(f, g)$ values for another combination of f' and g' are represented as $g_{21}, g_{22}, \ldots, g_{2M}$. Since there are M combinations of f' and g', values up to $g_{M1}$, $g_{M2}$, $g_{MM}$ can be defined.

If both sides of Equation 8 is divided by $a^*(f, g)$ and represented as a matrix, Equation 9 is obtained.

$$(a_1 \ a_2 \ \ldots \ a_M) \begin{pmatrix} g_{11} & g_{12} & \cdots & g_{1M} \\ g_{21} & \ddots & & g_{2M} \\ \vdots & & & \vdots \\ g_{M1} & g_{M2} & \cdots & I'_M \end{pmatrix} = \left(\frac{1}{a_1^*} \ \frac{1}{a_2^*} \ \cdots \ \frac{1}{a_M^*}\right) \begin{pmatrix} I'_1 & 0 & \cdots & 0 \\ 0 & I'_2 & & 0 \\ \vdots & & \ddots & \vdots \\ 0 & 0 & \cdots & I'_M \end{pmatrix} \quad \text{Equation 9}$$

To determine $a_1, a_2, \ldots, a_M$, appropriate values $b_1, b_2, \ldots, b_M$ are substituted into $a_1, a_2, \ldots, a_M$ on the left side of Equation 9, respectively. The substitution result is represented as Equation 10.

$$(b_1 \ b_2 \ \ldots \ b_M) \begin{pmatrix} g_{11} & g_{12} & \cdots & g_{1M} \\ g_{21} & \ddots & & g_{2M} \\ \vdots & & & \vdots \\ g_{M1} & g_{M2} & \cdots & g_{MM} \end{pmatrix} = \left(\frac{1}{a_1^*} \ \frac{1}{a_2^*} \ \cdots \ \frac{1}{a_M^*}\right) \begin{pmatrix} I'_1 & 0 & \cdots & 0 \\ 0 & I'_2 & & 0 \\ \vdots & & \ddots & \vdots \\ 0 & 0 & \cdots & I'_M \end{pmatrix} \quad \text{Equation 10}$$

Since $a_1, a_2, \ldots, a_M$ represent the diffracted light from the mask, $I'_1, I'_2, \ldots, I'_M$ are substituted in $b_1, b_2, \ldots, b_M$ to accurately determine $a_1, a_2, \ldots, a_M$ with a short period of time, for example. Equation 11 shows the substitution result.

$$(I'_1 \ I'_2 \ \ldots \ I'_M) \begin{pmatrix} g_{11} & g_{12} & \cdots & g_{1M} \\ g_{21} & \ddots & & g_{2M} \\ \vdots & & & \vdots \\ g_{M1} & g_{M2} & \cdots & g_{MM} \end{pmatrix} = \left(\frac{1}{a_1^*} \ \frac{1}{a_2^*} \ \cdots \ \frac{1}{a_M^*}\right) \begin{pmatrix} I'_1 & 0 & \cdots & 0 \\ 0 & I'_2 & & 0 \\ \vdots & & \ddots & \vdots \\ 0 & 0 & \cdots & I'_M \end{pmatrix} \quad \text{Equation 11}$$

By solving Equation 11 regarding $a^*(f, g), a_1, a_2, \ldots, a_M$ can be approximately calculated.

After calculating $a_1, a_2, \ldots, a_M$, the determined $a_1, a_2, \ldots, a_M$ are converted into spatial-domain data by inverse Fourier transform, whereby $o(x, y)$, namely, data of the mask (including the shape of the pattern, the transmittance, and the phase difference), can be calculated.

An original data generation method according to an exemplary embodiment of the present invention will now be described in detail.

Figure 16:
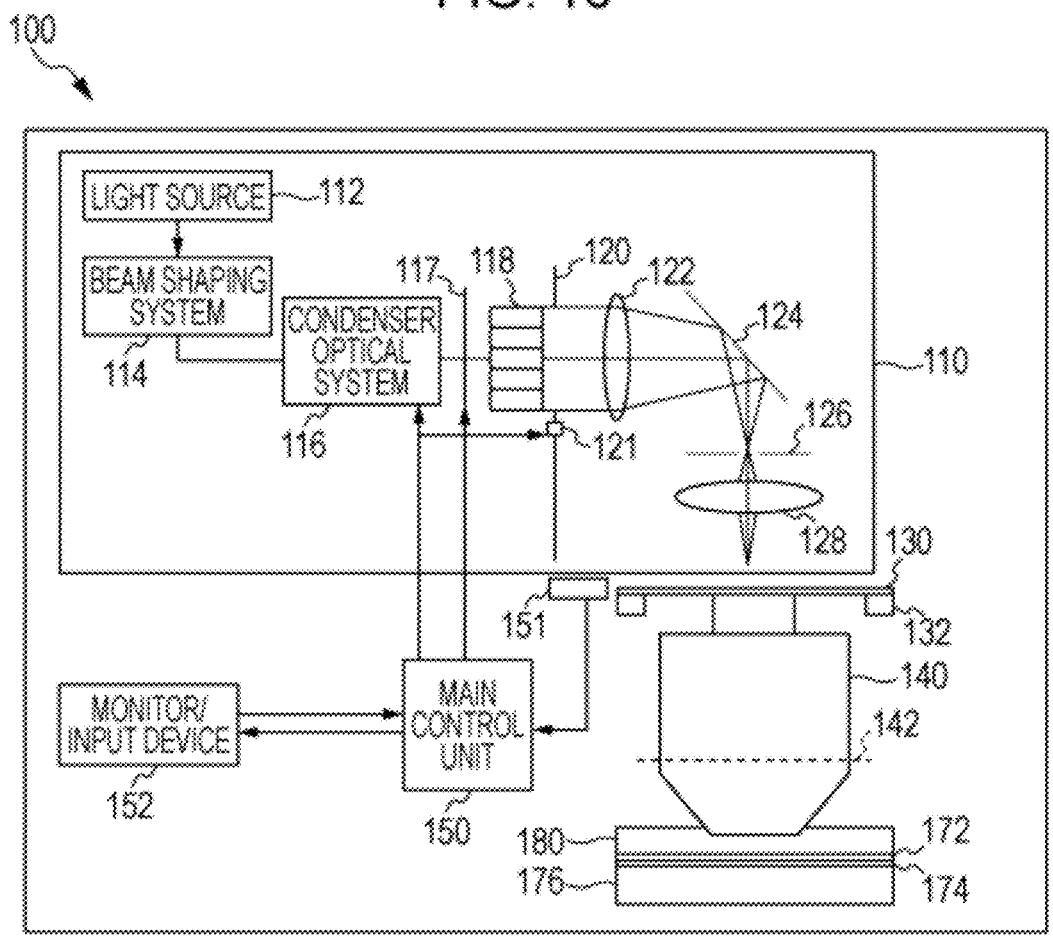
FIG. 16 is a schematic block diagram of an exposure apparatus according to an aspect of the present invention.

It is assumed that a wavelength λ of exposure light used by an exposure apparatus 100 (see FIG. 16) is equal to 248 nm and an image-side numerical aperture NA of a projection optical system 140 is equal to 0.73. The projection optical system 140 has no aberration. The light illuminating a mask is not polarized. Furthermore, a resist 172 applied onto a wafer 174 is ignored. A ratio of a numerical aperture of luminous flux incoming onto a mask plane (i.e., an object plane of the projection optical system) from an illumination optical system 110 to an object-side numerical aperture of the projection optical system 140 is represented by σ.

Figure 2A:
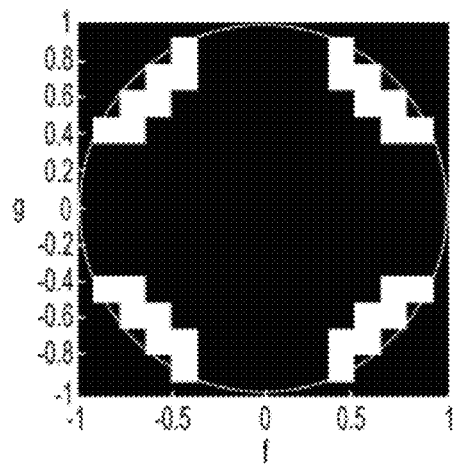
FIGS. 2A, 2B, 2C, 2D, 2E, and 2F show an example of an effective light source, an example of an intended pattern, data obtained by applying a low-pass filter onto an intended pattern, data obtained by performing Fourier transform on data shown in FIG. 2C, an example of a two-dimensional transmission cross coefficient, and a diffracted light distribution determined by solving Equation 10, respectively.
Figure 2B:
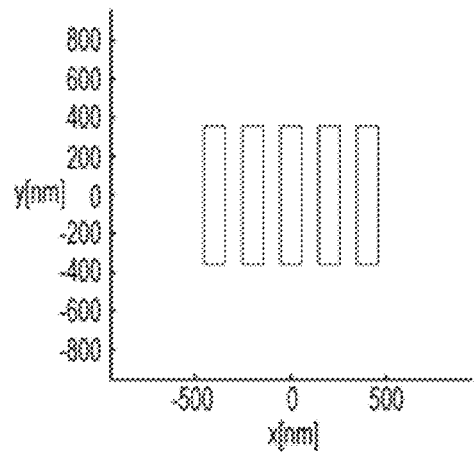
Figure 2C:
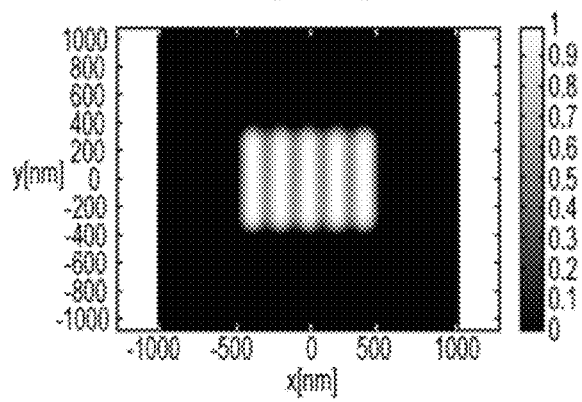
Figure 2D:
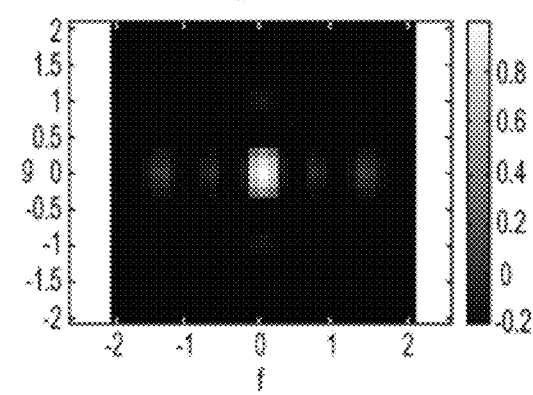

It is assumed that an effective light source is as shown in FIG. 2A. A white circle shown in FIG. 2A indicates σ=1. A white part corresponds to a light illumination part. There are four light illumination parts in FIG. 2A, which is a so-called quadrupole illumination. As shown in FIG. 2B, an intended pattern $I(x, y)$ to be formed on a wafer includes five lines. To form the pattern shown in FIG. 2B on a wafer, light intensity within the rectangular pattern is set equal to 1, whereas light intensity at other positions is set equal to 0 (1 and 0 may be switched). However, setting the light intensity on the wafer plane to binary values, namely, 1 and 0, is not practical. Accordingly, the light intensity distribution is corrected to be dull using a low-pass filter or the like on the light intensity distribution of the intended pattern. FIG. 2C shows a low-pass filter applied result by performing convolution integral of the intended pattern shown in FIG. 2B and a Gaussian function. If the intended pattern shown in FIG. 2C is converted into frequency-domain data using Fourier transform or the like, data $I'(f, g)$ shown in FIG. 2D is obtained.

Figure 2E:
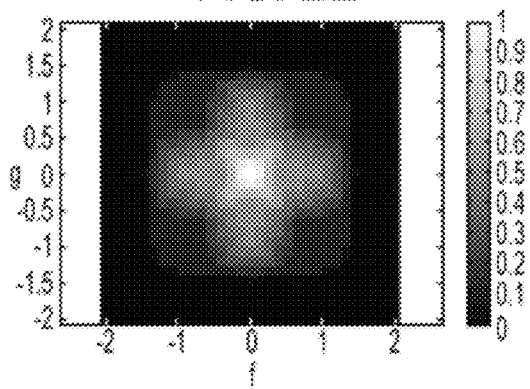

To determine $W_{f,g}(f, g)$, Equation 7 is used. In this example, there are 961 kinds (components) of (f', g'). Among those kinds, 605 combinations of (f', g') give $W_{f,g}(f, g)$ containing components that are not 0. FIG. 2E shows $W_{0,0}(f, g)$ as an example of $W_{f,g}(f, g)$.

Figure 2F:
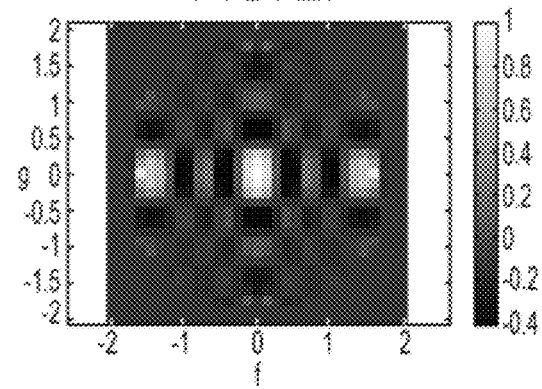
Figure 3A:
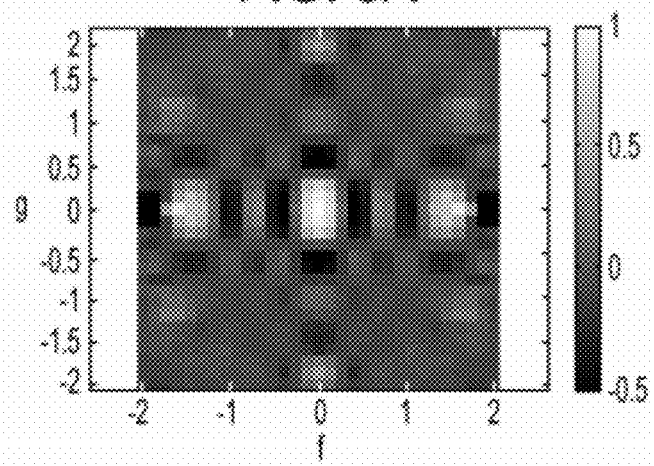
FIGS. 3A, 3B, and 3C show a diffracted light distribution defined over a whole calculation area by extrapolating data at an area where a diffracted light is not determined in FIG. 2F, ideal mask data determined by performing Fourier transform on data shown in FIG. 3A, and data obtained by converting ideal mask data shown in FIG. 3B into mask data that can be generated, respectively.

By substituting the determined $W_{f,g'(f, g)}$ and the data $I'(f, g)$ into Equation 11 to determine $a_1, a_2, \ldots, a_M$, a result shown in FIG. 2F is obtained. The diffracted light distribution $a_1, a_2, \ldots, a_M$ shown in FIG. 2F has an area including invalid data depending on $W_{f,g'(f, g)}$ because the diffracted light distribution is not determined at a part where $W_{f,g}(f, g)$ is 0 regarding any (f', g') combinations. Accordingly, the diffracted light distribution is determined by extrapolating data over a whole calculation area. FIG. 3A shows the extrapolation result. An extrapolation method for determining the data shown in FIG. 3A from the data shown in FIG. 2F will now be described. First, Fourier transform is performed on the data shown in FIG. 2F and a low spatial-frequency component is extracted. Inverse Fourier transform is then performed on the extracted component. The data resulting from the inverse Fourier transform is extrapolated in the area containing invalid data. Fourier transform is performed on the extrapolated data again and a low spatial-frequency component is extracted. Inverse Fourier transform is then performed. By repeating such a procedure, the data is extrapolated.

Figure 3B:
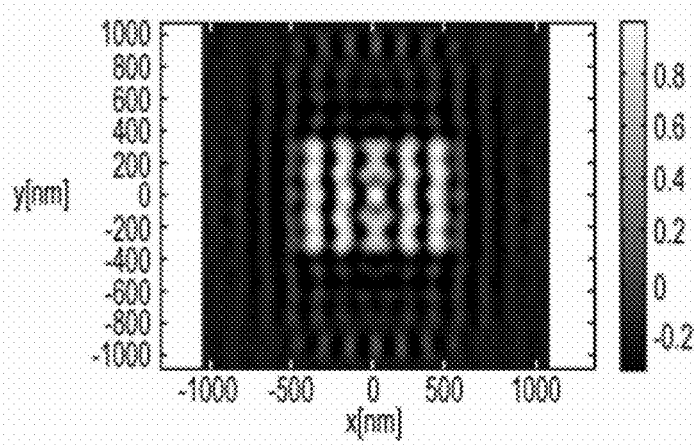

By converting the data shown in FIG. 3A into spatial-domain data using inverse Fourier transform or the like, data shown in FIG. 3B is obtained. A pattern shown in FIG. 3B indicates an ideal mask pattern. Although FIG. 3B shows amplitude of a mask that continuously changes, it is very difficult to fabricate a mask having continuously changing amplitude. Accordingly, the data shown in FIG. 3B is corrected into data, from which a mask can be readily fabricated.

Figure 3C:
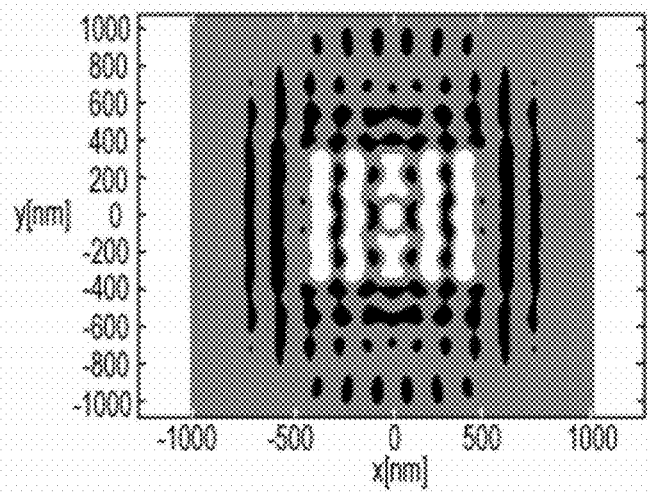

When the data shown in FIG. 3B is represented by a light transmitting part, a light shielding part, and a light attenuating part, data shown in FIG. 3C is obtained. A white part in FIG. 3C corresponds to the light transmitting part. A gray part in FIG. 3C corresponds to the light shielding part, whereas a black part in FIG. 3C corresponds to the light attenuating part. A characteristic of the light attenuating part is set so that the intensity of light passing through the light attenuating part is equal to 6% of the intensity of light passing through the light transmitting part. Furthermore, a phase difference between the light passing through the light attenuating part and the light passing through the light transmitting part is set to be 180 degrees. Such a light attenuating part is generally referred to as a halftone part.

Figure 4:
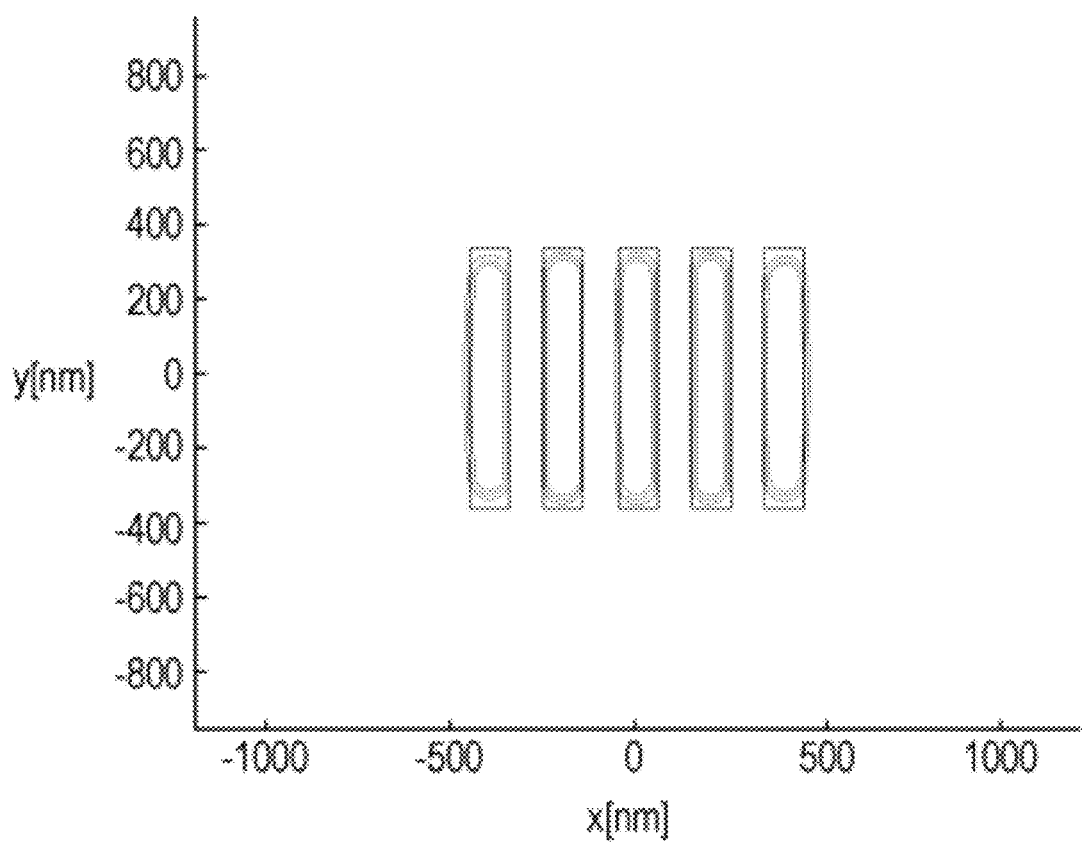
FIG. 4 is a diagram showing an aerial image simulation result obtained by using mask data shown in FIG. 3C.

FIG. 4 shows a simulation result of a light intensity distribution on an image plane of a projection optical system obtained using the mask data shown in FIG. 3C and the data of the effective light source shown in FIG. 2A. Although the length in the y-direction is slightly shorter than that of the intended pattern, a pattern resembling the intended pattern is accurately formed. In this manner, by using the original data generation method according to this exemplary embodiment of the present invention, it is possible to calculate mask data for accurately forming an intended pattern with a small amount of calculation.

A configuration of a computer for executing an original data generation program according to an exemplary embodiment will now be described with reference to FIG. 1.

A computer 1 includes a bus 10, a control unit 20, a display unit 30, a storage unit 40, an input unit 60, and a medium interface 70.

The control unit 20, the display unit 30, the storage unit 40, the input unit 60, and the medium interface 70 are connected to each other through the bus 10. The medium interface 70 can be connected to a recording medium 80.

The storage unit 40 stores pattern data 40a, mask data 40b, effective light source information 40c, NA information 40d, λ information 40e, aberration information 40f, polarization information 40g and an original data generation program 40i. The pattern data 40a is data of a pattern (also referred to as a layout pattern or an intended pattern) whose layout is designed in the designing of an integrated circuit. The mask data 40b is data for use in drawing of a pattern, such as Cr, on a mask. The effective light source information 40c regards a light intensity distribution formed on a pupil plane 142 of a projection optical system when a mask is absent (e.g., not placed) on an object plane of the projection optical system in an exposure apparatus 100 (see FIG. 16) to be described later. The NA information 40d regards an image-side numerical aperture NA of the projection optical system 140 of the exposure apparatus 100. The wavelength λ information 40e regards the wavelength λ of the exposure light used by the exposure apparatus 100. The aberration information 40f regards aberration of the projection optical system 140. When the projection optical system 140 of the exposure apparatus 100 exhibits birefringence, a phase shift is caused in accordance with the birefringence. This phase shift is considered as a kind of aberration. The polarization information 40g regards polarization of the illumination light formed by an illumination device 110 of the exposure apparatus 100. The original data generation program 40i is a program for generating data of an original (a mask or a reticle).

The control unit 20 may be, for example, a central processing unit (CPU), a graphics processing unit (GPU), a digital signal processor (DSP), or a microcomputer. The control unit 20 further includes a cache memory for temporary storage. The display unit 30 includes a display device, such as a cathode-ray tube (CRT) display or a liquid crystal display. The storage unit 40 may be, for example, a memory and a hard disk. The input unit 60 may be, for example, a keyboard and a mouse. The medium interface 70 may be, for example, a floppy disk drive, a CD-ROM drive, and a USB interface. The recording medium 80 may be a floppy disk, a CD-ROM, and a USB memory.

Figure 5:
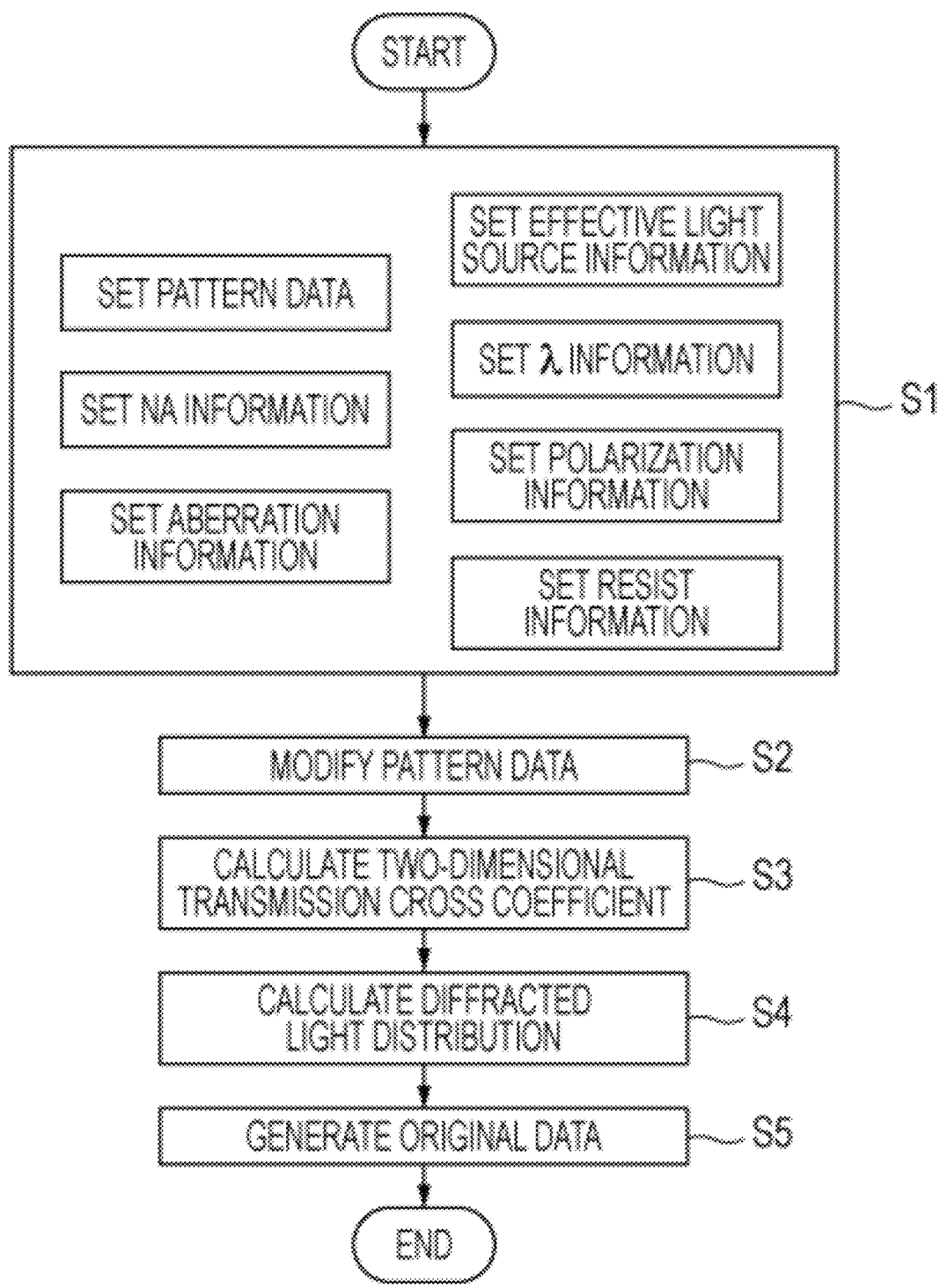
FIG. 5 is a flowchart showing an original data generation method according to an exemplary embodiment of the present invention.

A procedure for generating mask data by executing the original data generation program according to this exemplary embodiment of the present invention will now be described with reference to a flowchart shown in FIG. 5.

At STEP S1, the control unit 20 of the computer 1 sets the effective light source information 40c, the NA information 40d, the wavelength λ information 40e, the aberration information 40f, the polarization information 40g, and the pattern data 40a.

The effective light source information 40c (e.g., the effective light source data shown in FIG. 2A), the NA information 40d (e.g., 0.73), and the wavelength λ information 40e (e.g., 248 nm) are input previously. The aberration information 40f (e.g., aberration-free), the polarization information 40g (e.g., polarization-free) and the pattern data 40a (e.g., the data shown in FIG. 2B) are also input. The control unit 20 receives the above-described pieces of information and stores the information in the storage unit 40 to calculate the mask data 40b from the pattern data 40a. Here, the effective light source information 40c, the NA information 40d, the wavelength λ information 40e, the aberration information 40f, the polarization information 40g, and the pattern data 40a are collectively referred to as original data generation information.

The recording medium 80 storing the original data generation program 40i is connected to the medium interface 70. The original data generation program 40i is installed and stored in the storage unit 40 through the control unit 20.

A user inputs an instruction for activating the original data generation program 40i through the input unit 60. The control unit 20 receives the activation instruction of the original data generation program 40i and activates the original data generation program 40i with reference to the storage unit 40 in accordance with the activation instruction. The control unit 20 displays the original data generation information on the display unit 30 in accordance with the original data generation program 40i. The control unit 20 sets the original data generation information based on the instruction and stores the information.

At STEP S2, the control unit 20 of the computer 1 modifies (corrects) the pattern data 40a. The control unit 20 receives an instruction for modifying the pattern data 40a and refers to the storage unit 40 based on the instruction. The control unit 20 receives the pattern data 40a from the storage unit 40. For example, the control unit 20 applies a low-pass filter onto the pattern data 40a to modify the pattern data 40a into one shown in FIG. 2C. Although the low-pass filter is generally a Gaussian function, any other low-pass filters may be used. The modified pattern data may be displayed on the display unit 30. The modified pattern data is converted into frequency-domain data using Fourier transform or the like.

At STEP S3, the control unit 20 determines a two-dimensional transmission cross coefficient. Calculation of the two-dimensional transmission cross coefficient is executed using Equation 7 based on a function representing the effective light source and a pupil function. The effective light source information is used in the function representing the effective light source, whereas the NA information, the aberration information, and the polarization information are used in the pupil function.

At STEP S4, the control unit 20 calculates a diffracted light distribution from a mask on an object plane. The calculation of the diffracted light distribution is executed using Equation 9, Equation 10, or Equation 13 to be described later. The control unit 20 also extrapolates the data of the diffracted light distribution in a manner described above.

At STEP S5, the control unit 20 calculates the mask data 40b. The control unit 20 converts the diffracted light distribution calculated at STEP S4 into spatial-domain data using inverse Fourier transform or the like to generate ideal mask data. The control unit 20 then converts the ideal mask data into mask data that can be generated in practice. The control unit 20 refers to the storage unit 40 and generates the mask data 40b including mask data that can be generated. The control unit 20 displays the mask data 40b on the display unit 30 instead of the pattern data 40a. The control unit 20 also stores the mask data 40b in the storage unit 40.

By supplying the mask data 40b to an EB drawing apparatus as an input, it is possible to draw a pattern, such as Cr, according to the mask data 40b on a mask. In this manner, the mask can be fabricated.

As described above, the original data generation program 40i according to this exemplary embodiment of the present invention allows the mask data 40b suitable for exposure of a minute pattern to be generated. More specifically, since the mask data 40b suitable for minute-pattern exposure can be generated without solving an optimization problem, the calculation can be generally simplified. Accordingly, time for generating the mask data 40b can be shortened. Moreover, it is possible to accurately calculate original data from an intended pattern to be formed with a small amount of calculation.

Further exemplary embodiments of original data generation methods (programs) in accordance with the present invention will be described in detail below with reference to the drawings.

In a first exemplary embodiment of the present invention, a case where an exposure apparatus employs NA equal to 0.86 and a wavelength equal to 248 nm will be discussed. A projection optical system has no aberration. An illuminated light is not polarized. Furthermore, a resist is ignored. It is assumed that an intended pattern is a line pattern shown in FIG. 2B. Effective light source information 40c is set so that an effective light source is as shown in FIG. 2A.

As described above, mask data calculated using an original data generation method is as shown in FIG. 3C. Technical advantages of using the mask data shown in FIG. 3C will be discussed.

Figure 6:
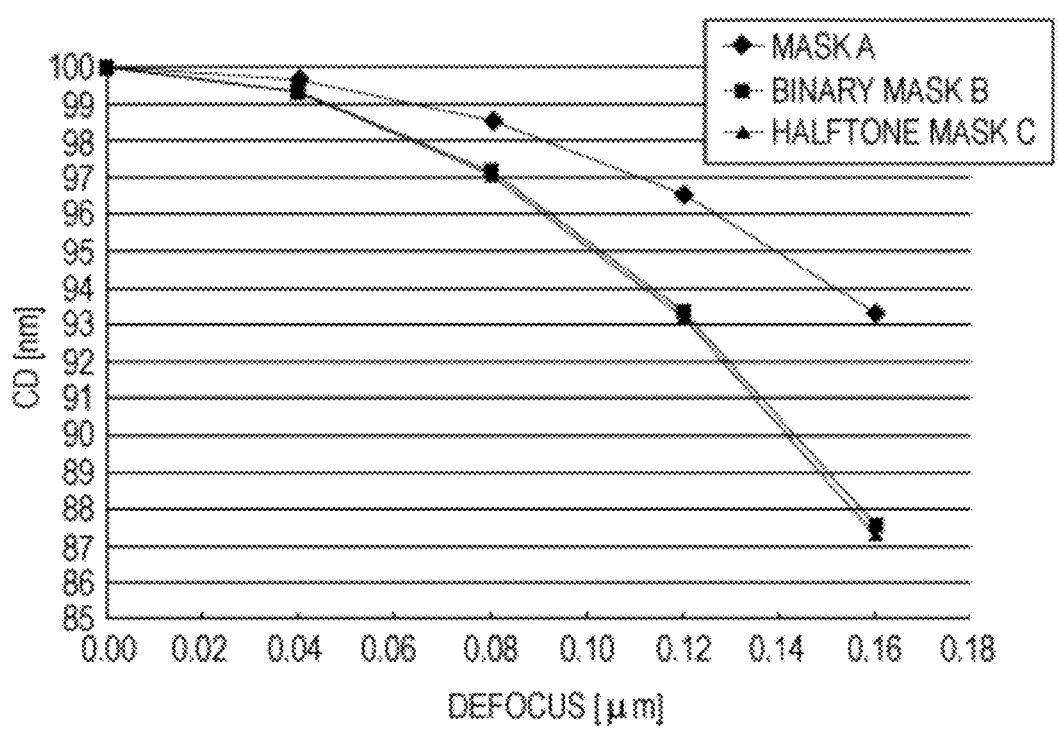
FIG. 6 is a diagram showing imaging characteristics of a mask fabricated using mask data obtained by an original data generation method according to an exemplary embodiment of the present invention and masks according to the related art.

A mask in which five bar patterns are formed using a binary mask and a mask in which five bar patterns are formed with a halftone mask are also discussed as comparative examples. FIG. 6 shows simulation results of a change in a line width (CD) against defocus regarding a mask A (FIG. 3C) fabricated using the original data generation method according to this exemplary embodiment, a binary mask B according to the related art, and a halftone mask C according to the related art. The change of CD in response to the change in a defocusing amount is the smallest when the mask A is used. Accordingly, the mask A is resistant to the change in defocusing and has a good imaging characteristic.

Figure 7A:
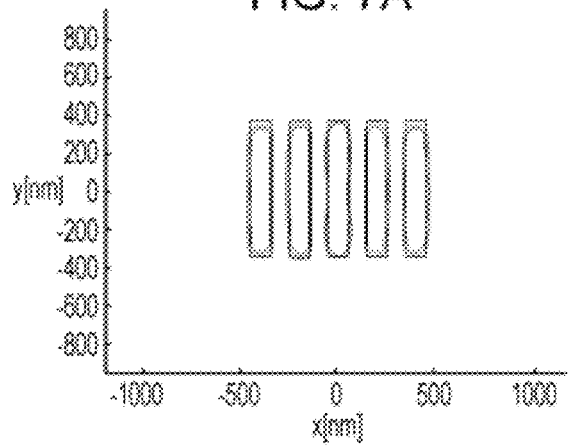
FIGS. 7A and 7B respectively show an aerial image at a best focus position of a mask A in accordance with the present invention and an aerial image at a defocus position of the mask A in accordance with the present invention; whereas FIGS. 7C, 7D, 7E, and 7F respectively show an aerial image at the best focus position of a binary mask B according to the related art, an aerial image at the defocus position of the binary mask B according to the related art, an aerial image at the best focus position of a halftone mask C according to the related art, and an aerial image at the defocus position of the halftone mask C according to the related art.
Figure 7B:
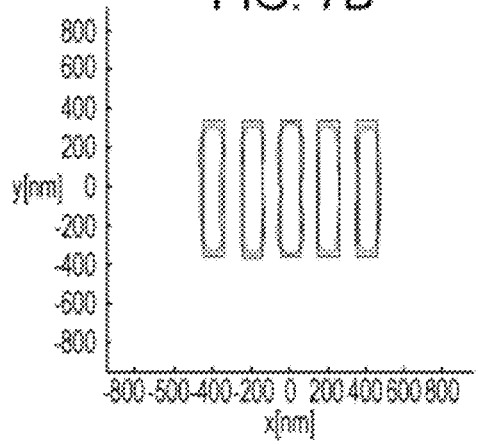

FIG. 7A shows a light intensity distribution (aerial image) at a best focus position when the mask A is used. Five bars are formed as intended. FIG. 7B shows an aerial image at a position of a defocusing amount equal to 0.16 μm when the mask A is used. Although the aerial image becomes thinner, the shape of the intended pattern is maintained.

Figure 7C:
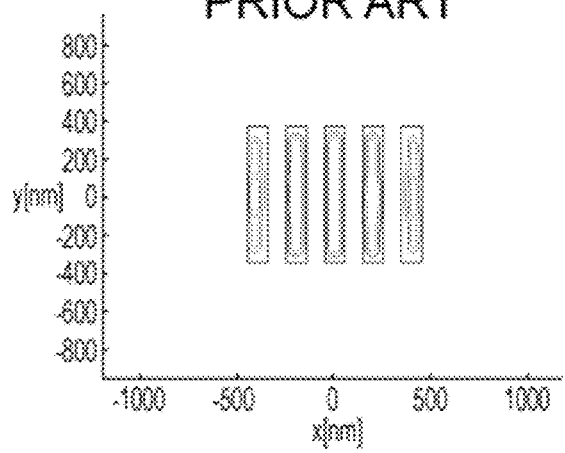
Figure 7D:
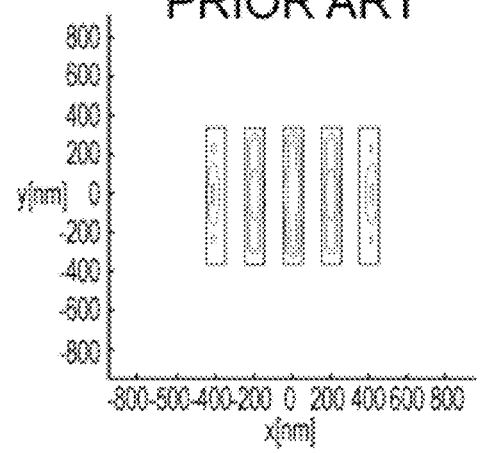

In contrast, FIG. 7C shows an aerial image at the best focus position when the binary mask B according to the related art is used. Although a bar located at the center has a shape resembling the shape of the intended pattern, bars located at peripheral areas do not have the shape resembling the shape of the intended pattern. FIG. 7D shows an aerial image at the position of the defocusing amount equal to 0.16 μm when the binary mask B according to the related art is used. The shape of the intended pattern is no longer maintained.

Figure 7E:
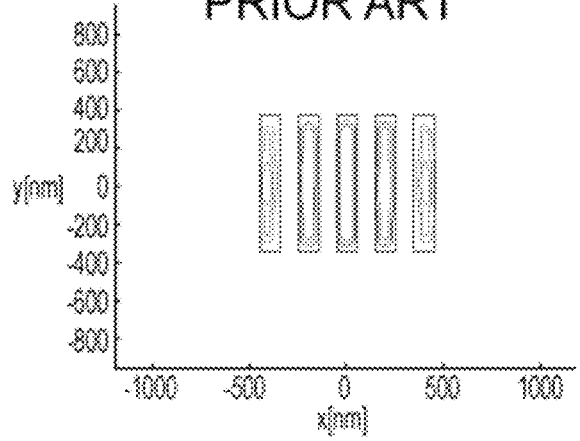
Figure 7F:
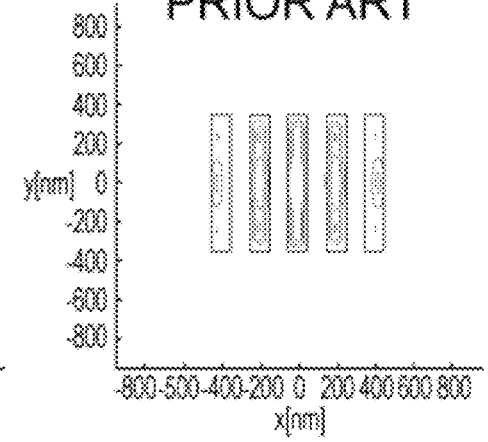

FIG. 7E shows an aerial image at the best focus position when the halftone mask C according to the related art is used. Although a bar located at the center has a shape resembling the shape of the intended pattern, bars located at peripheral areas do not have a shape resembling the shape of the intended pattern. FIG. 7F shows an aerial image at the position of the defocusing amount equal to 0.16 μm when the halftone mask C according to the related art is used. The shape of the intended pattern is no longer maintained.

As described above, the use of a mask fabricated using the original data generation method according to the exemplary embodiment allows a pattern to be accurately formed on a wafer.

In a second exemplary embodiment of the present invention, a difference in calculated mask data resulting from different pattern-data modification (correction) methods will now be discussed in detail.

It is assumed that the same original data generation information as that used in the exemplary embodiment 1 is used. Mask data is calculated by substituting $I'_1, I'_2, \ldots, I'_M$ into $b_1, b_2, \ldots, b_M$ of Equation 10. As described above, a result shown in FIG. 3B is obtained by calculating the mask data after correcting pattern data (binary data represented by 0 and 1) shown in FIG. 2B into one shown in FIG. 2C.

Figure 8A:
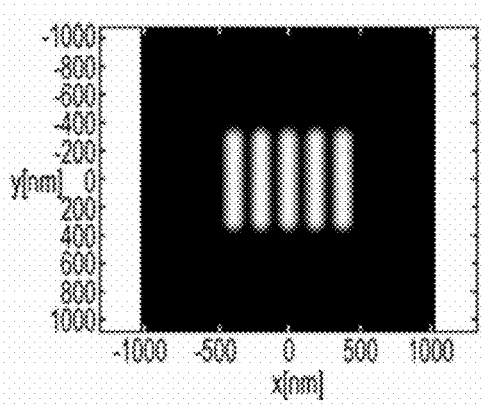
FIGS. 8A, 8B, 8C, 8D, 8E, and 8F show data obtained by applying a low-pass filter onto an intended pattern, mask data calculated from data shown in FIG. 8A, data obtained by adding phase information to an intended pattern, an example of an effective light source, a mask data calculation result obtained in consideration of phase information, and an aerial image simulation result obtained by using a mask shown in FIG. 8E, respectively.
Figure 8B:
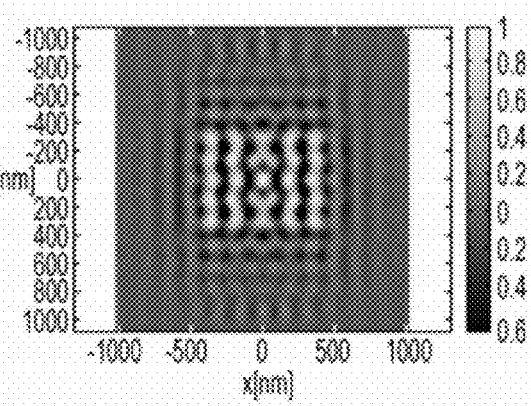

On the other hand, if the mask data is calculated after correcting the pattern data (binary data represented by 0 and 1) shown in FIG. 2B while suppressing dullness as shown in FIG. 8A, a result shown in FIG. 8B is obtained. Comparison of the results shown in FIGS. 3B and 8B reveals that the result shown in FIG. 8B has a larger negative value. More specifically, as the binary pattern data is dulled more, the calculated mask data resembles the binary mask data more. As the degree of dulling the binary pattern data is smaller, the calculated mask data resembles phase shift mask data.

Accordingly, mask data can be calculated after previously determining whether a mask to be fabricated is a binary mask or a phase shift mask and selecting a binary pattern-data modification method in accordance with the kinds of mask.

Another modification method will now be described. Since the intended pattern is represented by light intensity, negative values do not exist. However, negative values are set for the intended pattern here. Setting negative values equates to defining a phase for the intended pattern (pattern data).

Figure 8C:
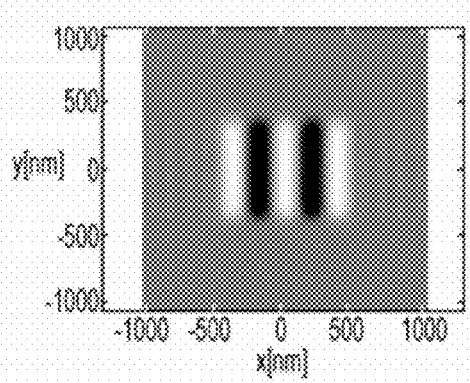
Figure 8D:
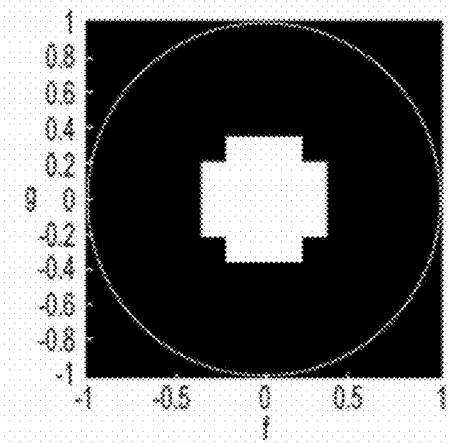
Figure 8E:
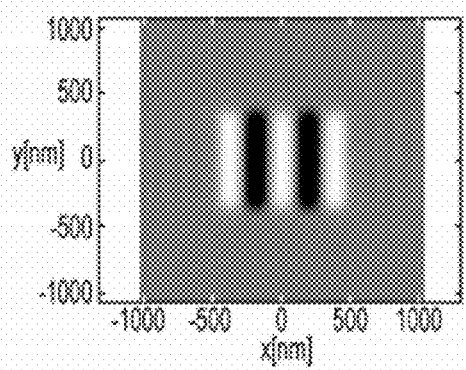
Figure 8F:
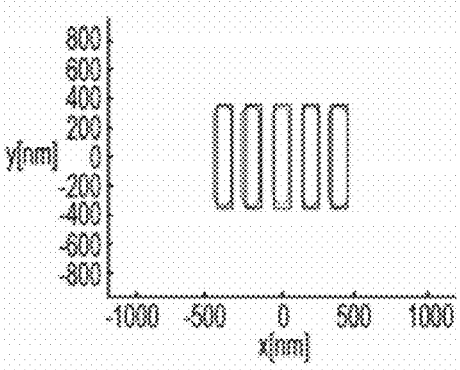

For example, as shown in FIG. 8C, a negative value and a positive value are alternately assigned to five boards. FIG. 8C shows a result obtained by applying a low-pass filter on the pattern data. The effective light source information 40c is set as shown in FIG. 8D. When the original data generation method according to this exemplary embodiment is executed using these pieces of data, mask data shown in FIG. 8E is obtained. The calculated mask data is different from one shown in FIG. 3B. FIG. 8F shows a simulation result of a light intensity distribution on a wafer plane obtained using the effective light source information shown in FIG. 8D and the mask data shown in FIG. 8E. FIG. 8F reveals that the intended pattern, namely, five bars, is formed.

As described above, mask data can be correctly calculated even if phase information is included in an intended pattern.

An aerial image may differ from a pattern (resist image) formed on a wafer due to an effect of a resist or the like. In such a case, the intended pattern to be formed on the wafer may be corrected into the pattern of the aerial image in consideration of information of the resist, and the mask data may be calculated using the corrected pattern data.

Preferably, an accurate diffracted light distribution is determined by solving Equation 9 when mask data is determined. However, since Equation 9 is not easily solved, in a third exemplary embodiment of the present invention, an approximate expression of Equation 10 is used.

Accordingly, to avoid the accuracy from decreasing due to the approximation, a method for improving accuracy of calculation of the mask data will be described in this exemplary embodiment.

It is assumed that the same original data generation information as that used in the exemplary embodiment 1 is used. As described above, data shown in FIG. 2F is obtained by approximately determining a diffracted light distribution $a_1$, $a_2, \ldots, a_M$ using Equation 11. The diffracted light distribution shown in FIG. 2F is not exactly the same as the diffracted light distribution that is obtained by solving Equation 9 but is approximate data that resembles the accurate diffracted light distribution.

To distinguish the diffracted light distribution determined using Equation 11 from the accurate diffracted light distribution, the former one is represented as $a'_1, a'_2, \ldots, a'_M$. The diffracted light distribution $a'_1, a'_2, \ldots, a'_M$ is obviously closer to the accurate diffracted light distribution $a_1, a_2, \ldots, a_M$ than $I'_1, I'_2, \ldots, I'_M$. Accordingly, substitution of $a'_1, a'_2, \ldots, a'_M$ into $b_1, b_2, \ldots, b_M$ of Equation 10 makes the approximation more accurate. More specifically, Equation 12 is obtained.

$$(a'_1 \ a'_2 \ \ldots \ a'_M) \begin{pmatrix} g_{11} & g_{12} & \cdots & g_{1M} \\ g_{21} & \ddots & & g_{2M} \\ \vdots & & & \vdots \\ g_{M1} & g_{M2} & \cdots & g_{MM} \end{pmatrix} =$$

$$\left( \frac{1}{a_1^*} \ \frac{1}{a_2^*} \ \cdots \ \frac{1}{a_M^*} \right) \begin{pmatrix} I'_1 & 0 & \cdots & 0 \\ 0 & I'_2 & & 0 \\ \vdots & & \ddots & \vdots \\ 0 & 0 & \cdots & I'_M \end{pmatrix}$$

Equation 12

A more accurately approximated diffracted light distribution can be determined using Equation 12. Furthermore, if the diffracted light distribution is determined by substituting the diffracted light distribution obtained using Equation 12 into $a'_1, a'_2, \ldots, a'_M$ of Equation 12 again as temporary data, the diffracted light distribution having higher approximation accuracy can be obtained.

Figure 9:
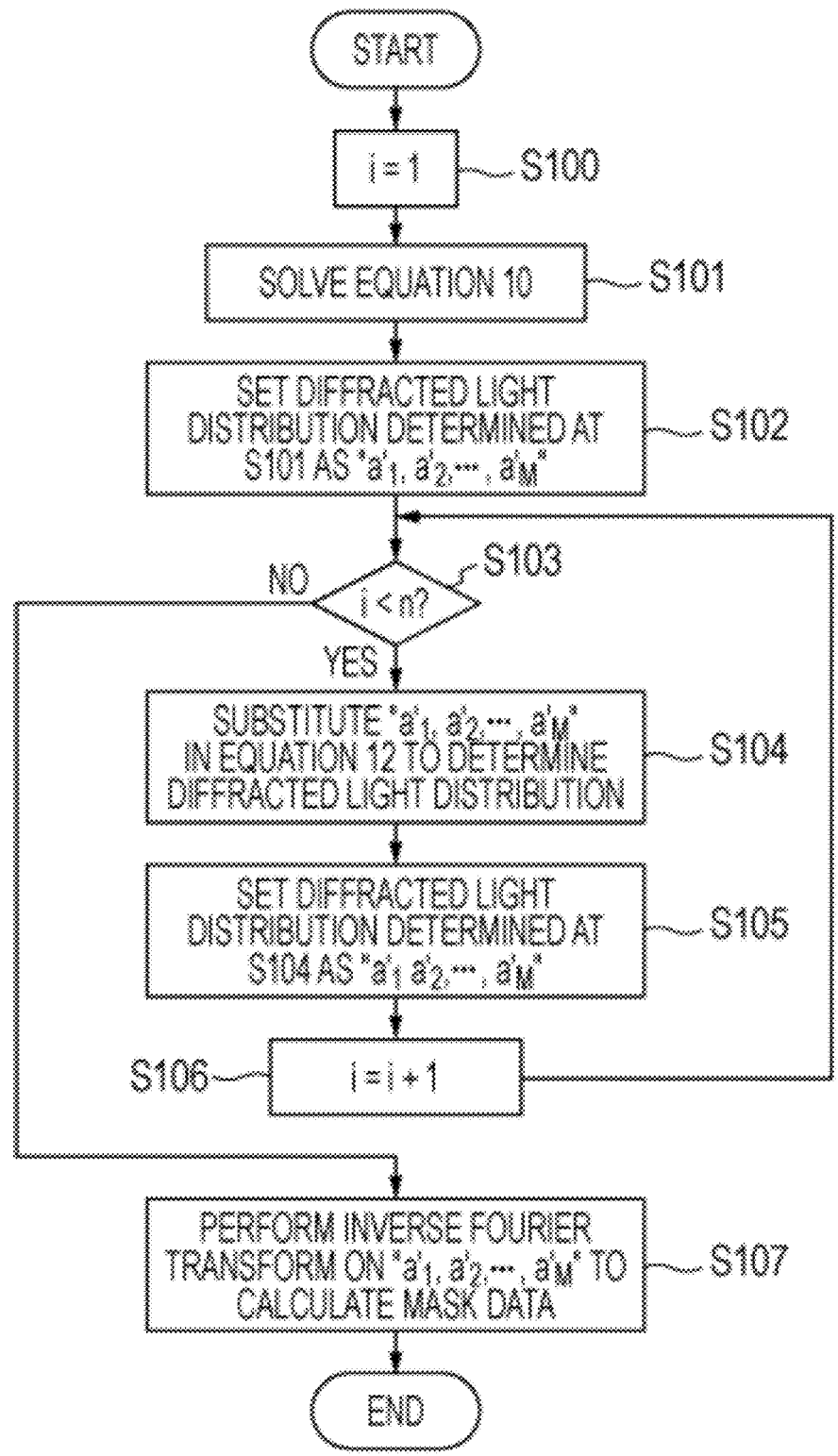
FIG. 9 is a flowchart showing an original data generation method executed when a diffracted light distribution is determined by repeated calculation.

The above-described procedure is shown in a flowchart of FIG. 9. At STEP S100, a value "i" representing the number of times of repetition is initialized to 1.

At STEP S101, Equation 10 is solved. More specifically, the diffracted light distribution is approximately calculated by substituting appropriate values into $b_1, b_2, \ldots, b_M$ of Equation 10.

At STEP S102, the diffracted light distribution calculated at STEP S101 is set as $a'_1, a'_2, \ldots, a'_M$.

At STEP S103, whether the number of times of repetition "i" is smaller than a predetermined value n is determined. If the value "i" is smaller than the value n, the process proceeds to STEP S104. If the value "i" is not smaller than the value n, the process proceeds to STEP S107.

At STEP S104, Equation 12 is solved. More specifically, the diffracted light distribution $a_1, a_2, \ldots, a_M$ is calculated by substituting $a'_1, a'_2, \ldots, a'_M$ in Equation 12.

At STEP S105, the diffracted light distribution determined at STEP S104 is set as $a'_1, a'_2, \ldots, a'_M$.

At STEP S106, a value obtained by incrementing the number of times of repetition "i" by 1 is newly defined as "i". The process then returns to STEP S103.

At STEP S107, the mask data is calculated by converting the ultimately calculated diffracted light distribution $a'_1, a'_2, \ldots, a'_M$ into spatial-domain data using inverse Fourier transform or the like.

The mask data is calculated by executing the above-described steps. If the value n is equal to 1, Equation 10 is simply solved. If the value n is equal to or larger than 2, the mask data that is closer to an exact solution than one determined when the value n is equal to 1 can be calculated.

Figure 10:
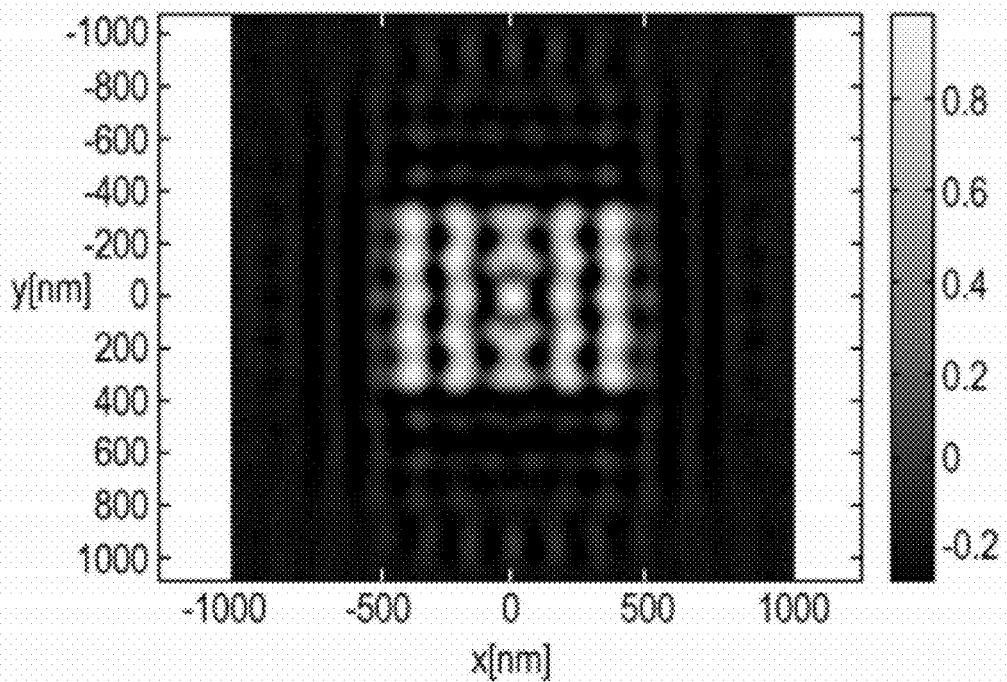
FIG. 10 is a diagram showing mask data obtained using an original data generation method according to a third exemplary embodiment of the present invention.

Here, it is assumed that the same original data generation information as that used in the exemplary embodiment 1 is used. First, $I'_1, I'_2, \ldots, I'_M$ are substituted in $b_1, b_2, \ldots, b_M$ of Equation 10. When the mask data is calculated in accordance with the flowchart showing in FIG. 9 regarding a case where n is equal to 5, mask data shown in FIG. 10 is obtained.

In a fourth exemplary embodiment of the present invention, it is assumed that the same original data generation information as that used in the exemplary embodiment 1 is used. Mask data obtained by performing inverse Fourier transform on a diffracted light distribution calculated using Equation 9 or the like is as shown in FIG. 3B. Since the data shown in FIG. 3B indicates an ideal mask and generation thereof is practically difficult, the data shown in FIG. 3B has to be converted into one that can be readily generated. In this exemplary embodiment, a method for converting the mask data into one that can be readily generated will be described in detail below.

According to an available mask fabricating technique, a light transmitting part, a light attenuating part, a light shielding part and a phase shift part can be formed as patterns. Furthermore, a phase difference between the light passing through the light attenuating part and the light passing through the light transmitting part can be set equal to 180 degrees. Accordingly, the ideal mask data is categorized into the light transmitting part, the light attenuating part, the light shielding part, and the phase shift part.

In this exemplary embodiment, a case of categorizing ideal mask data into the light transmitting part, the light attenuating part, and the light shielding part will be discussed. A method for categorizing the data by providing predetermined thresholds may be used as the categorization method. For example, an area of the mask data shown in FIG. 3B having a value equal to or larger than 0.30 is categorized into the light transmitting part. An area having a value that is equal to or larger than −0.05 and is smaller than 0.30 is categorized into the light shielding part. An area having a value smaller than −0.05 is categorized into the light attenuating part. Additionally, the phase difference between the light passing through the light attenuating part and the light passing through the light transmitting part is set equal to 180 degrees.

Figure 11:
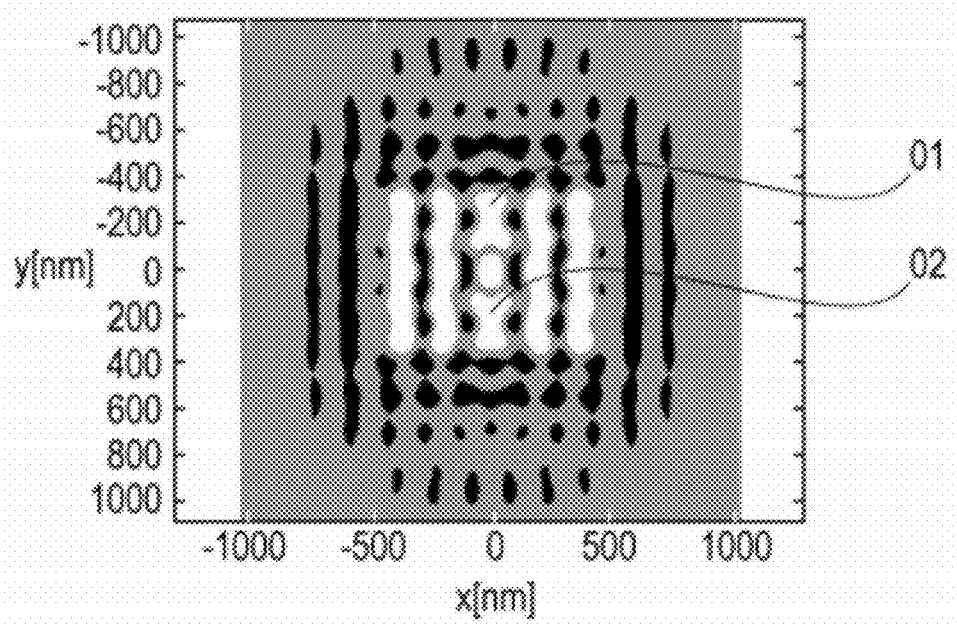
FIG. 11 is a diagram showing a result of categorizing ideal mask data into a light transmitting part, a light attenuating part, and a light shielding part.

FIG. 11 shows a result of categorizing the ideal mask data in the above-described manner. Here, a white part represents the light transmitting part. A gray part represents the light shielding part, whereas a black part represents the light attenuating part.

Among the light transmitting parts shown in FIG. 11, a light transmitting part O1 and a light transmitting part O2 are problematic because the area corresponding to the light transmitting parts O1 and O2 of the ideal mask originally has a small value. However, since the area has a value equal to or larger than the threshold 0.30, the area is categorized into the light transmitting part. Accordingly, an effect of the light transmitting parts O1 and O2 is too strong.

Figure 12:
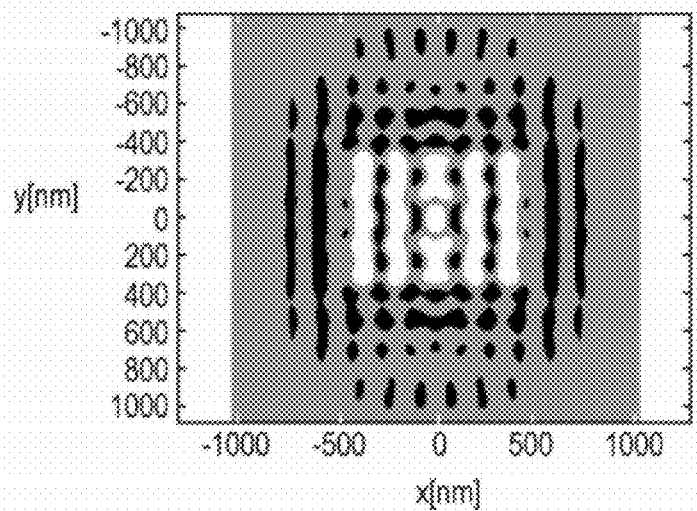
FIG. 12 is a diagram showing a result obtained by adjusting the size of an area O1 and the size of an area O2 shown in FIG. 11.
Figure 13A:
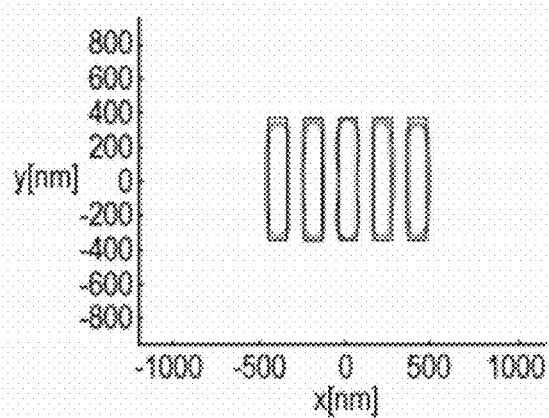
FIGS. 13A and 13B show an aerial image simulation result obtained by using a mask shown in FIG. 11 and an aerial image simulation result obtained by using a mask shown in FIG. 12, respectively.
Figure 13B:
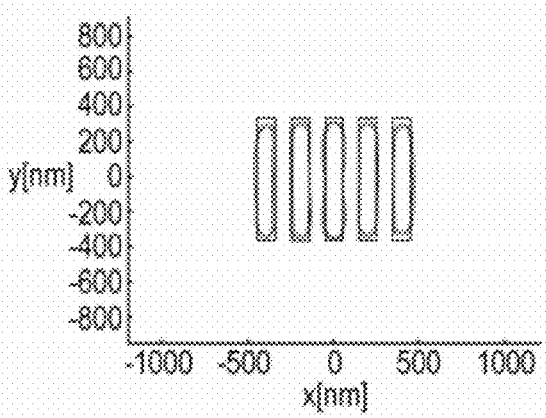

Thus, the effect of the light transmitting parts O1 and O2 has to be reduced. More specifically, the area of the light transmitting parts O1 and O2 has to be decreased. A result of decreasing the area of the light transmitting parts O1 and O2 is as shown in FIG. 12. FIGS. 13A and 13B show a result of simulation performed using the mask data shown in FIG. 11 and a result of simulation performed using the mask data shown in FIG. 12, respectively.

FIGS. 13A and 13B show an aerial image at a best focus position. Referring to FIG. 13A, light intensity of a bar located at the center is strong, due to which intensity of bars located at peripheral parts is low. In contrast, referring to FIG. 13B, five bars are substantially in the same shape. Accordingly, a decrease in the area of the light transmitting parts O1 and O2 provides a good advantage.

In a fifth exemplary embodiment of the present invention, a method is provided for calculating mask data with a smaller calculation amount.

Determination of M kinds (components) of $W_{f,g}(f, g)$ in Equation 10 takes some time. However, all of the M kinds of $W_{f,g}(f, g)$ do not have to be determined. Accordingly, Equation 10 is modified as shown by Equation 13. In Equation 13, M' is not larger than M.

$$(b_1 \ b_2 \ \ldots \ b_{M'}) \begin{pmatrix} g_{11} & g_{12} & \cdots & g_{1M} \\ g_{21} & \ddots & & g_{2M} \\ \vdots & & & \vdots \\ g_{M'1} & g_{M'2} & \cdots & g_{M'M} \end{pmatrix} = \quad \text{Equation 13}$$

$$\begin{pmatrix} \frac{1}{a_1^*} & \frac{1}{a_2^*} & \cdots & \frac{1}{a_M^*} \end{pmatrix} \begin{pmatrix} I'_1 & 0 & \cdots & 0 \\ 0 & I'_2 & & 0 \\ \vdots & & \ddots & \vdots \\ 0 & 0 & \cdots & I'_M \end{pmatrix}$$

If M'=M in Equation 13, Equation 13 is the same as Equation 10. If M' is smaller than M, all of the M kinds of $W_{f,g}(f, g)$ do not have to be determined, and thus calculation is simplified.

An example will be described. A simplest case where M'=1 will be considered. The most important $W_{f,g}(f, g)$ of all of the kinds of $W_{f,g}(f, g)$ is $W_{0,0}(f, g)$ because a pupil function overlaps a function representing an effective light source. Accordingly, an example of calculating mask data only using $W_{0,0}(f, g)$ is described.

There are M $W_{0,0}(f, g)$ values and those values are represented as $g_{11}, g_{12}, \ldots, g_{1M}$. A function obtained by performing Fourier transform on I(x, y) is set as I'(f, g). I'(0, 0) at (f', g')=(0, 0) is set as $I'_1$. By substituting $I'_1$ into $b_1$ of Equation 13, Equation 14 can be obtained.

$$I'_1(g_{11} \ g_{12} \ \cdots \ g_{1M}) = \begin{pmatrix} \frac{1}{a_1^*} & \frac{1}{a_2^*} & \cdots & \frac{1}{a_M^*} \end{pmatrix} \begin{pmatrix} I'_1 & 0 & \cdots & 0 \\ 0 & I'_2 & & 0 \\ \vdots & & \ddots & \vdots \\ 0 & 0 & \cdots & I'_M \end{pmatrix} \quad \text{Equation 14}$$

A diffracted light distribution $a_1, a_2, \ldots, a_M$ can be determined using Equation 14. The above-described procedure will be described with reference to the drawings.

Figure 14A:
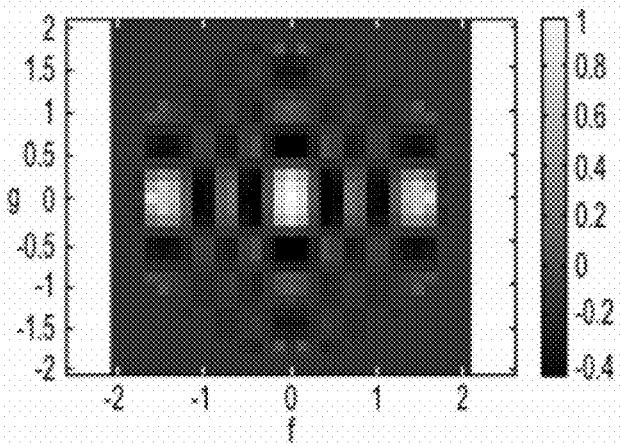
FIGS. 14A, 14B, and 14C show a diffracted light distribution calculated from a two-dimensional transmission cross coefficient, a result obtained by extrapolating data at an area containing no diffracted light distribution value in FIG. 14A, and an ideal mask obtained by performing inverse Fourier transform on data shown in FIG. 14B, respectively.
Figure 14B:
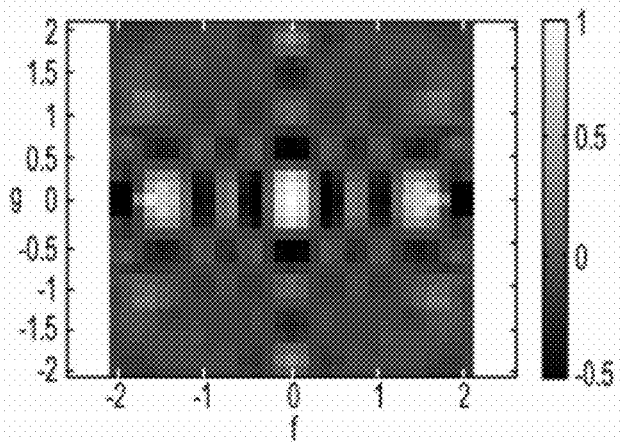
Figure 14C:
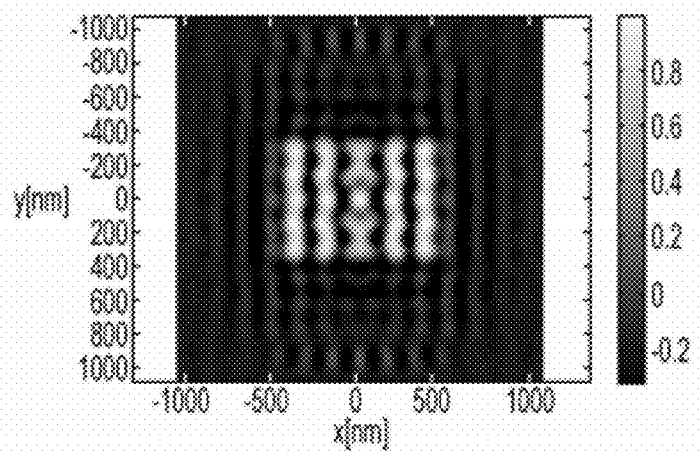

It is assumed that the same original data generation information as that used in the exemplary embodiment 1 is used. As described above, when $W_{0,0}(f, g)$ is calculated, data shown in FIG. 2E is obtained. When Fourier transform is performed after obtaining a light intensity distribution shown in FIG. 2C by applying a low-pass filter on pattern data representing an intended pattern, data shown in FIG. 2D is obtained. If the diffracted light distribution $a_1, a_2, \ldots, a_M$ is determined by substituting these pieces of data in Equation 14, data shown in FIG. 14A is obtained. By extrapolating data in an area where the diffracted light distribution is not determined in FIG. 14A, data shown in FIG. 14B is obtained. By performing inverse Fourier transform on the data shown in FIG. 14B, mask data shown in FIG. 14C is obtained.

A result of calculating the mask data by determining $W_{f,g}(f, g)$ regarding all of (f', g') combinations is as shown in FIG. 3B. Comparison of data shown in FIGS. 3B and 14C indicates that the pieces of data hardly differ from one another.

More specifically, by using at least one kind of $W_{f,g}(f, g)$ instead of using all of M kinds of $W_{f,g}(f, g)$, data close to optimum mask data can be calculated.

Figure 15A:
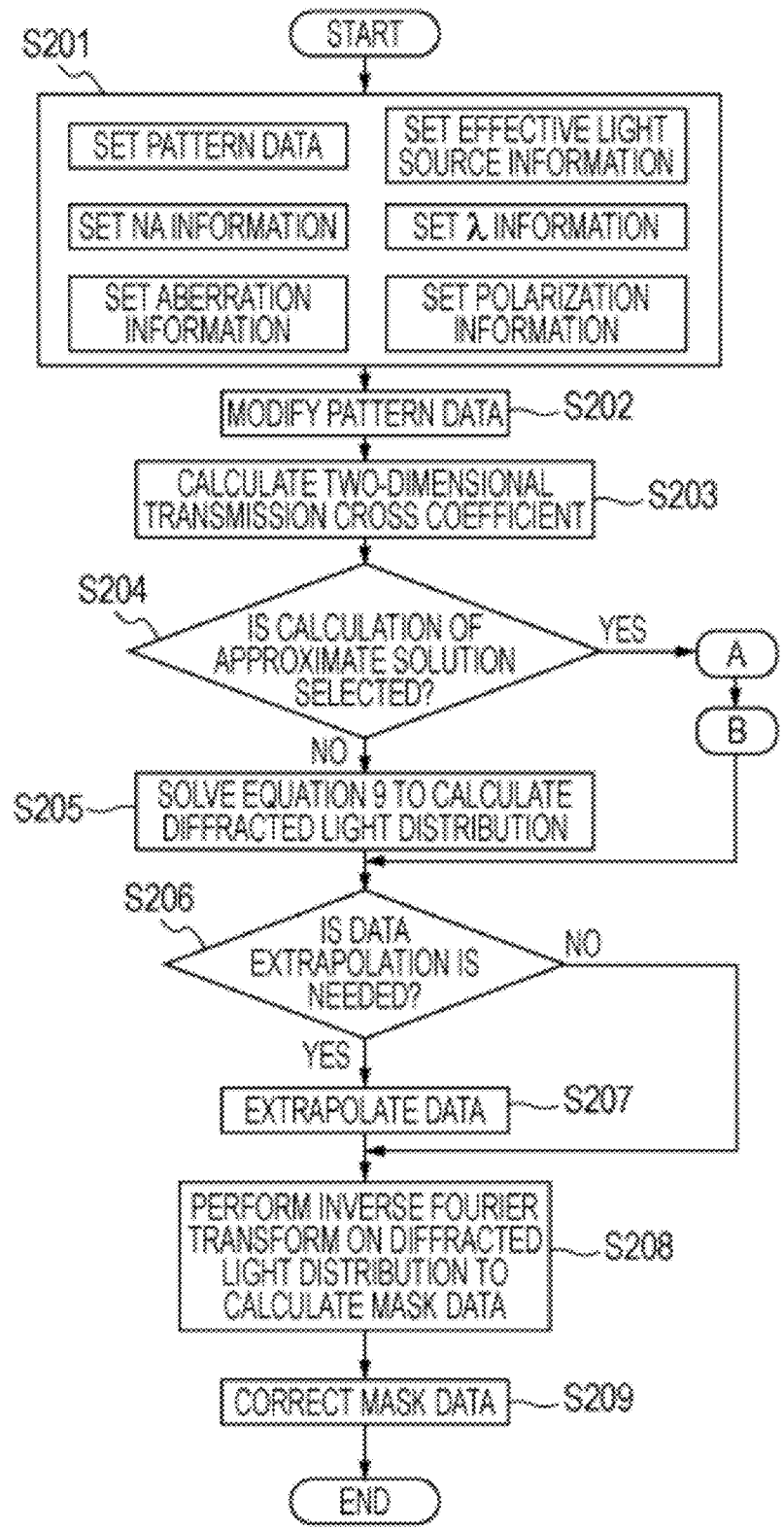
FIGS. 15A and 15B are a flowchart showing a detail of an original data generation method and a flowchart showing processing executed between STEPs A and B, respectively.
Figure 15B:
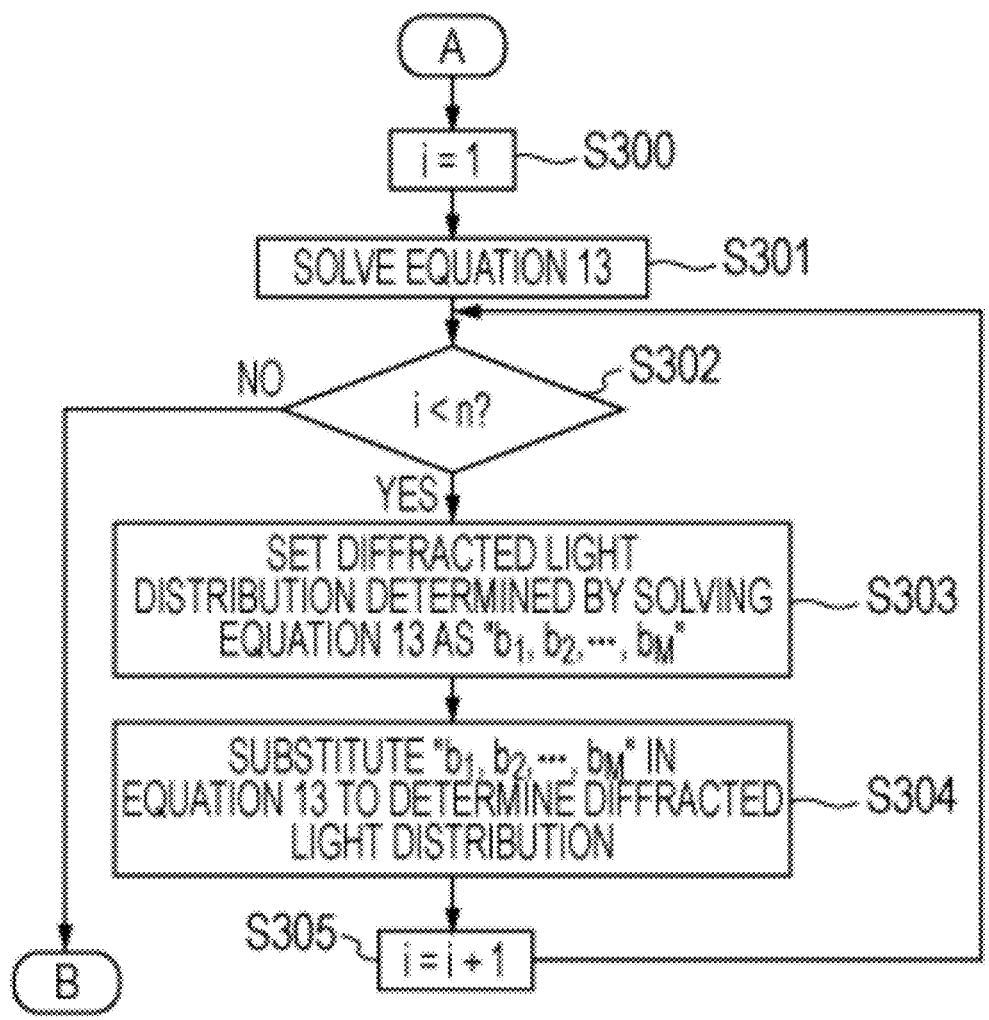

FIGS. 15A and 15B show a procedure that collectively includes the detailed original data generation processes according to an exemplary embodiment including the above-described exemplary embodiments.

At STEP S201, the control unit 20 of the computer 1 sets the effective light source information 40c, the NA information 40d, the wavelength λ information 40e, the aberration information 40f, the polarization information 40g, and the pattern data 40a.

The recording medium 80 storing the original data generation program 40i is connected to the medium interface 70. The original data generation program 40i is installed and stored in the storage unit 40 through the control unit 20.

A user inputs an instruction for activating the original data generation program 40i through the input unit 60. The control unit 20 receives the activation instruction of the original data generation program 40i and displays the original data generation information on the display unit 30 in accordance with the original data generation program 40i stored in the storage unit 40 based on the activation instruction. The control unit 20 sets the original data generation information based on the instruction.

At STEP S202, the control unit 20 of the computer 1 modifies the pattern data 40a. The control unit 20 receives an instruction for modifying the pattern data 40a and refers to the storage unit 40 based on the modification instruction. The control unit 20 receives the pattern data 40a from the storage unit 40. For example, the control unit 20 uses a low-pass filter to modify the pattern data 40a. Phase information and resist information may be included in the pattern data 40a. The control unit 20 displays the modified pattern data on the display unit 30 and stores the modified pattern data in the storage unit 40.

At STEP S203, the control unit 20 calculates a two-dimensional transmission cross coefficient. The control unit 20 refers to the storage unit 40 and determines the two-dimensional transmission cross coefficient from the original data generation information. The two-dimensional transmission cross coefficient is calculated using Equation 7. The calculated two-dimensional transmission cross coefficient is stored in the storage unit 40. The order of STEPs S202 and S203 may be switched.

At STEP S204, the control unit 20 determines whether to calculate an approximate solution or an exact solution of a diffracted light distribution. When the approximate solution is determined, the process proceeds to STEP A. When the exact solution is determined, the process proceeds to STEP S205.

At STEP S205, the control unit 20 solves Equation 9 to calculate the diffracted light distribution $a_1, a_2, \ldots, a_M$. To solve Equation 9, the control unit 20 performs Fourier transform on the modified pattern data. This conversion is included in STEP S205. The calculated diffracted light distribution is stored in the storage unit 40.

At STEP S206, the control unit 20 determines whether to extrapolate (interpolate) data at an area where the diffracted light distribution is not calculated. If the data of the diffracted light distribution is extrapolated, the process proceeds to STEP S207. If the data of the diffracted light distribution is not extrapolated, the process proceeds to STEP S208.

At STEP S207, data is extrapolated in the calculated diffracted light distribution. The control unit 20 receives the diffracted light distribution from the storage unit 40 and extrapolates the data. The control unit 20 stores the data-extrapolated diffracted light distribution in the storage unit 40.

At STEP S208, the control unit 20 calculates mask data. More specifically, the control unit 20 receives the data-extrapolated diffracted light distribution from the storage unit 40 and converts the diffracted light distribution into data in a spatial domain using inverse Fourier transform or the like to calculate ideal mask data. The ideal mask data is stored in the storage unit 40.

At STEP S209, the control unit 20 corrects the ideal mask data into mask data that can be readily generated. More specifically, the control unit 20 receives the ideal mask data from the storage unit 40 and discretely categorizing the ideal mask data using thresholds to generate the mask data. The generated mask data is displayed on the display unit 30.

A procedure executed between STEPs A and B will now be described. As described above with respect to the third exemplary embodiment, the diffracted light distribution is calculated through repeated calculation.

At STEP S300, a value "i" representing the number of times of repetition is initialized to 1. More specifically, the control unit 20 of the computer 1 sets the value "i" representing the number of times of repetition to an initial value 1 and stores the value "i" in the storage unit 40.

At STEP S301, Equation 13 is solved. The control unit 20 substitutes appropriate values in $b_1, b_2, \ldots, b_M$ of Equation 13 to approximately calculate a diffracted light distribution using M' kinds (at least one kind) of $W_{f,g}(f, g)$. The calculated approximate diffracted light distribution is stored in the storage unit 40.

At STEP S302, whether the value "i" representing the number of times of repetition is smaller than a predetermined value n is determined. If the value "i" is smaller than n, the process proceeds to STEP S303. If the value "i" is not smaller than n, the process proceeds to STEP B.

At STEP S303, the control unit 20 refers to the storage unit 40 and sets the diffracted light distribution $a_1, a_2, \ldots, a_M$ determined by solving Equation 13 at STEP S301 as $b_1, b_2, \ldots, b_M$.

At STEP S304, the control unit 20 substitutes $b_1, b_2, \ldots, b_M$ in Equation 13 to newly calculate the diffracted light distribution $a_1, a_2, \ldots, a_M$. The calculated diffracted light distribution $a_1, a_2, \ldots, a_M$ is stored in the storage unit 40.

At STEP S305, the control unit 20 increments the value "i" representing the number of times of repetition by 1 and newly defines the incremented value as "i". More specifically, the control unit 20 refers to the storage unit 40 and newly stores the value obtained by incrementing the value "i" representing the number of times of repetition by 1 in the storage unit 40 as the value "i". The process then returns to STEP S302.

A mask is fabricated using the mask data obtained by executing the above-described original data generation method. An exposure apparatus 100 using a mask fabricated in such a manner will be described below with reference to FIG. 16.

The exposure apparatus 100 includes an illumination device 110, a mask stage 132, a projection optical system 140, a main control unit 150, a monitor/input device 152, a wafer stage 176, and a liquid 180 serving as a medium. This exposure apparatus 100 is an immersion exposure apparatus that exposes a mask pattern onto a wafer 174 through the liquid 180 provided between a final surface of the projection optical system 140 and the wafer 174. The exposure apparatus 100 may employ a step-and-scan projection exposure system (i.e., a scanner), a step-and-repeat system, or other exposure systems.

The illumination device 110 illuminates a mask 130 on which a circuit pattern to be transferred is formed. The illumination device 110 has a light source unit and an illumination optical system.

The light source unit includes a laser 112 serving as a light source and a beam shaping system 114. The laser 112 can use light emitted from a pulse laser, such as an ArF excimer laser having the wavelength of approximately 193 nm, a KrF excimer laser having the wavelength of approximately 248 nm, and an F2 excimer laser having the wavelength of approximately 157 nm. The type and number of lasers are not limited. Further, the kinds of the light source unit are not limited.

The beam shaping system 114 can use, for example, a beam expander having a plurality of cylindrical lenses. The beam shaping system 114 converts an aspect ratio of the cross-sectional size of parallel light from the laser 112 into a desired value to form the beam shape into a desired one.

The illumination optical system is an optical system that illuminates the mask 130. In an exemplary embodiment, the illumination optical system includes a condenser optical system 116, a polarization controller 117, an optical integrator 118, an aperture stop 120, a condenser lens 112, a folding mirror 124, a masking blade 126, and an imaging lens 128. The illumination optical system can realize various illumination modes, such as modified illumination shown in FIG. 2A.

The condenser optical system 116 includes a plurality of optical elements and efficiently leads the flux of light in a desired shape to the optical integrator 118. The condenser optical system 116 includes an exposure amount adjuster capable of adjusting an exposure amount of illumination light onto the mask 130 for each illumination mode. The exposure amount adjuster is controlled by the main control unit 150.

The polarization controller 117 includes, for example, a polarization element, and is placed at a position corresponding to a pupil 142 of the projection optical system 140. As described in the exemplary embodiment 2, the polarization controller 117 controls a polarization state of a predetermined area of an effective light source formed on the pupil 142. The polarization controller 117 including a plurality of kinds of polarization elements may be provided on a turret that can be rotated by an actuator (not shown). The main control unit 150 may control driving of the actuator.

The optical integrator 118 equalizes the illumination light that illuminate the mask 130. The optical integrator 118 is configured as a fly-eye lens that converts an angular distribution of the incident light into a positional distribution and allows the light to exit therefrom. The fly-eye lens includes a combination of multiple rod lenses (minute lens elements), and a Fourier-transform relationship is maintained between an incident surface and an emergent surface. However, the optical integrator 118 is not limited to the fly-eye lens. Optical rods, diffraction gratings, and a plurality of sets of cylindrical lens array boards arranged so that the sets are orthogonal to one another are alternatives included within the scope of the optical integrator 118.

Immediately behind the emergent surface of the optical integrator 118, the aperture stop 120 having a fixed shape and diameter is provided. The aperture stop 120 is arranged at a position substantially conjugate with the effective light source formed on the pupil 142 of the projection optical system 140. The shape of the aperture of the aperture stop 120 is equivalent to a light intensity distribution (effective light source) formed on the pupil 142 of the projection optical system 140 when the mask is absent (e.g. not placed) on the object plane of the projection optical system 140. The effective light source is controlled by the aperture stop 120.

The aperture stop 120 can be exchanged by an aperture stop exchanging mechanism (actuator) 121 so that the aperture stop 120 is positioned within an optical path according to illumination conditions. The driving of the actuator 121 is controlled by a drive control unit 151 that is controlled by the main control unit 150. The aperture stop 120 can be integrated with the polarization controller 117.

The condenser lens 122 condenses a plurality of light fluxes emitted from a secondary light source provided in the proximity of the emergent surface of the optical integrator 118 and passing through the aperture stop 120. Then, the light is reflected on the folding mirror 124. The condenser lens 122 evenly illuminates a surface of the masking blade 126 serving as an illumination target surface by Kohler's illumination.

The masking blade 126 includes a plurality of movable light shielding boards. The masking blade 126 has a substantially rectangular arbitrary aperture shape equivalent to an effective area of the projection optical system 140. The imaging lens 128 projects the aperture shape of the masking blade 126 onto the surface of the mask 130 with the light to transfer the aperture shape of the masking blade 126.

The mask 130 is fabricated according to the above-described ordinal data generating method. The mask 130 is supported and driven by the mask stage 132. The diffracted light emitted from the mask 130 passes through the projection optical system 140 and then is projected onto the wafer 174. The mask 130 and the wafer 174 are arranged in an optically conjugate positional relationship. A binary mask, a halftone mask, and a phase shift mask can be used as the mask 130.

The projection optical system 140 has a function for forming, on the wafer 174, an image of a diffracted light passing through a pattern formed on the mask 130. As the projection optical system 140, an optical system including a plurality of lens elements, an optical system including a plurality of lens elements and at least one concave mirror (catadioptric optical system), and an optical system having a plurality of lens elements and at least one diffractive optical element can be used.

The main control unit 150 controls driving of each unit. In particular, the main control unit 150 controls illumination based on information input through an input unit of the monitor/input device 152 and information from the illumination device 110. Control information and other information of the main control unit 150 are displayed on a monitor of the monitor/input device 152.

A photoresist 172 is applied on the wafer 174. A liquid crystal substrate or other substrates can be used instead of the wafer 174.

The wafer 174 is supported by the wafer stage 176. As the liquid 180, a material having high transmittance with respect to the exposure wavelength, with which no smear adheres to the projection optical system, and well matches the resist process is selected.

The light flux emitted from the laser 112 during exposure is led to the optical integrator 118 through the condenser optical system 116 after the beam is shaped by the beam shaping system 114. The optical integrator 118 equalizes the illumination light. The aperture stop 120 sets the effective light source shown in FIG. 2A, for example. The illumination light illuminates the mask 130 through the condenser lens 122, the folding mirror 124, the masking blade 126, and the imaging lens 128 under an optimum illumination condition. The light flux passing through the mask 130 is reduction-projected on the wafer 174 by the projection optical system 140 at a predetermined reduction ratio.

The final surface of the projection optical system 140 facing the wafer 174 is immersed in the liquid 180 having a higher refractive index than air. Accordingly, the NA value of the projection optical system 140 becomes high and the resolution of an image formed on the wafer 174 becomes high. Furthermore, by the polarization control, an image having high contrast is formed on the resist 172. Accordingly, the exposure apparatus 100 can provide a high-quality device by transferring the pattern onto the resist with a high accuracy.

A method for manufacturing a device (a semiconductor IC device or a LCD device) utilizing the above-described exposure apparatus 100 will be described. The device is manufactured by executing a process for exposing a photoresist-applied substrate (such as a wafer and a glass substrate) using the above-described exposure apparatus, a process for developing the substrate (photoresist), and other known processes. The other known processes include etching, resist removal, dicing, bonding, and packaging. According to this device manufacturing method, devices having higher quality than those according to the related art can be manufactured.

As many apparently widely different embodiments of the present invention can be made without departing from the spirit and scope thereof, it is to be understood that the invention is not limited to the specific embodiments thereof.

While the present invention has been described with reference to exemplary embodiments, it is to be understood that the invention is not limited to the disclosed exemplary embodiments. The scope of the following claims is to be accorded the broadest interpretation so as to encompass all modifications and equivalent structures and functions.

This application claims the benefit of Japanese Patent Application No. 2008-203251 filed on Aug. 6, 2008, which is hereby incorporated by reference herein in its entirety.

What is claimed is:

1. A non-transitory computer-readable recording medium storing an original data generation program for causing a computer to calculate data of an original to be used when an image of a pattern of the original is projected onto a substrate through a projection optical system by illuminating the original with an illumination device, the original data generation program comprising:
- computer-executable instructions for setting an intended pattern to be formed on the substrate;
- computer-executable instructions for converting data regarding the intended pattern into frequency-domain data;
- computer-executable instructions for calculating a two-dimensional transmission cross coefficient using a function representing a light intensity distribution that the illumination device forms on a pupil plane of the projection optical system when the original is absent on an object plane of the projection optical system and using a pupil function of the projection optical system;
- computer-executable instructions for calculating a diffracted light distribution from a pattern that is formed on the object plane using both the frequency-domain data and data of the calculated two-dimensional transmission cross coefficient; and
- computer-executable instructions for converting data of the calculated diffracted light distribution into spatial-domain data and determining the data of the original using the spatial-domain data.

2. The non-transitory computer-readable recording medium according to claim 1, wherein the diffracted light distribution is calculated by an approximation using data obtained by converting the data regarding the intended pattern into the frequency-domain data.

3. The non-transitory computer-readable recording medium according to claim 1, wherein temporary data of the diffracted light distribution is calculated using the frequency-domain data and the data of the calculated two-dimensional transmission cross coefficient, and the diffracted light distribution is calculated using the temporary data, the frequency-domain data, and the data of the calculated two-dimensional transmission cross coefficient.

4. The non-transitory computer-readable recording medium according to claim 1, wherein data obtained by correcting the data regarding the intended pattern with a low-pass filter is converted into the frequency-domain data.

5. The non-transitory computer-readable recording medium according to claim 1, wherein the frequency-domain data is obtained by supplementing the data regarding the intended pattern with phase information and converting the supplemented frequency-domain data into the frequency-domain data.

6. The non-transitory computer-readable recording medium according to claim 1, wherein the two-dimensional transmission cross coefficient is calculated by convolution of a complex conjugate function of the pupil function and a product of the function representing the light intensity distribution and a function obtained by shifting the pupil function.

7. The non-transitory computer-readable recording medium according to claim 1,
- wherein the two-dimensional transmission cross coefficient has a plurality of components, and
- a diffracted light distribution from a pattern that is formed on the object plane is calculated using both the frequency-domain data and data of one component among the plural components of the calculated two-dimensional transmission cross coefficient.

8. An original data generation method for calculating data of an original to be used when an image of a pattern of the original is projected onto a substrate through a projection optical system by illuminating the original with an illumination device, the original data generation method being executed by a computer, the original data generation method comprising:
- setting an intended pattern to be formed on the substrate;
- converting data regarding the intended pattern into frequency-domain data;
- calculating a two-dimensional transmission cross coefficient using a function representing a light intensity distribution that the illumination device forms on a pupil plane of the projection optical system when the original is absent on an object plane of the projection optical system and using a pupil function of the projection optical system;
- calculating a diffracted light distribution from a pattern that is formed on the object plane using both the frequency-domain data and data of the calculated two-dimensional transmission cross coefficient; and
- converting data of the calculated diffracted light distribution into spatial-domain data and determining the data of the original using the spatial-domain data.

9. An original fabricating method for fabricating an original to be used when an image of a pattern of the original is projected onto a substrate through a projection optical system by illuminating the original with an illumination device, the original fabricating method comprising:
- generating data of the original using the original data generation method according to claim 8 by a computer; and
- fabricating the original using the generated data by an original fabricating apparatus.

10. An exposure method for projecting an image of a pattern of an original onto a substrate through a projection optical system by illuminating the original with an illumination device, the exposure method comprising:
- fabricating the original using the original fabricating method according to claim 9 by the original fabricating apparatus;
- illuminating the fabricated original with the illumination device by an exposure apparatus; and
- projecting the image of the pattern of the fabricated original onto the substrate through the projection optical system by the exposure apparatus.

11. A device manufacturing method comprising:
- projecting an image of a pattern of an original onto a substrate using the exposure method according to claim 10 by an exposure apparatus; and
- processing the substrate being exposed by the exposure apparatus to produce a device by a processing apparatus.

* * * * *